US012720830B2

(12) United States Patent
Sakurada et al.

(10) Patent No.: US 12,720,830 B2
(45) Date of Patent: Aug. 25, 2026

(54) METHOD OF MANUFACTURING SILICON CARBIDE SUBSTRATE, SILICON CARBIDE SINGLE-CRYSTAL SUBSTRATE AND SILICON CARBIDE SEMICONDUCTOR DEVICE

(71) Applicant: SUMITOMO ELECTRIC INDUSTRIES, LTD., Osaka (JP)

(72) Inventors: Takashi Sakurada, Osaka (JP); Taro Nishiguchi, Osaka (JP); Tetsuro Kondo, Osaka (JP); Naoki Matsumoto, Osaka (JP); Makoto Sasaki, Osaka (JP); Hirofumi Yamamoto, Osaka (JP)

(73) Assignee: DENSO CORPORATION, Aichi (JP)

( * ) Notice: Subject to any disclaimer, the term of this patent is extended or adjusted under 35 U.S.C. 154(b) by 618 days.

(21) Appl. No.: 18/029,903

(22) PCT Filed: Jul. 27, 2021

(86) PCT No.: PCT/JP2021/027708

§ 371 (c)(1),
(2) Date: Apr. 1, 2023

(87) PCT Pub. No.: WO2022/074903

PCT Pub. Date: Apr. 14, 2022

(65) Prior Publication Data

US 2023/0369411 A1 Nov. 16, 2023

(30) Foreign Application Priority Data

Oct. 6, 2020 (JP) ................................. 2020-169062

(51) Int. Cl.
*H10D 62/832* (2025.01)
*C30B 29/36* (2006.01)
(Continued)

(52) U.S. Cl.
CPC ......... *H10D 62/8325* (2025.01); *C30B 29/36* (2013.01); *H10P 14/2904* (2026.01); *H10W 46/00* (2026.01); *H10W 46/301* (2026.01)

(58) Field of Classification Search
CPC .. H10D 62/8325; H10D 12/00; H10D 30/021; H10D 30/0291; H10D 30/60;
(Continued)

(56) References Cited

U.S. PATENT DOCUMENTS

2008/0272396 A1* 11/2008 Fournel ............... H01L 21/0265 257/190
2012/0302051 A1* 11/2012 Matsuno ............... H10D 8/051 438/571
(Continued)

FOREIGN PATENT DOCUMENTS

JP 3-44056 A 2/1991
JP H4-62858 A 2/1992
(Continued)

OTHER PUBLICATIONS

English translation of JP-2009044083-A (Year: 2009).*

*Primary Examiner* — William B Partridge
*Assistant Examiner* — David Paul Sedorook
(74) *Attorney, Agent, or Firm* — Renner, Otto, Boisselle & Sklar, LLP

(57) ABSTRACT

A method of manufacturing a silicon carbide semiconductor device includes the following steps. In a silicon carbide substrate including a silicon carbide single-crystal substrate and a silicon carbide epitaxial film provided on the silicon carbide single-crystal substrate, a reference mark serving as a reference of two dimensional position coordinates is formed. After forming the reference mark, at least one of polishing or cleaning is performed on a reference mark formation surface of the silicon carbide substrate. Position coordinates of a defect present in the silicon carbide substrate are specified based on the reference mark. A device active region is formed in the silicon carbide substrate. Position coordinates of the device active region are specified based on the reference mark. A pass/fail judgement of the
(Continued)

device active region is made by associating the position coordinates of the defect with the position of the device active region.

18 Claims, 18 Drawing Sheets

(51) Int. Cl.
*H10P 14/20* (2026.01)
*H10W 46/00* (2026.01)

(58) Field of Classification Search
CPC ...... H10D 30/66; H10D 12/441; H10D 18/60; C30B 29/36; C30B 25/186; C30B 25/20; H01L 21/02378; H01L 23/544; H01L 2223/54426; H01L 21/02576; H01L 21/0262; H01L 21/02529; H01L 22/10; H01L 2223/5442; H01L 2223/54433
See application file for complete search history.

(56) References Cited

U.S. PATENT DOCUMENTS

| | | | | |
|---|---|---|---|---|
| 2013/0093581 | A1* | 4/2013 | Arai | B60R 1/1207<br>340/435 |
| 2014/0138705 | A1* | 5/2014 | Zhang | H10D 62/8325<br>257/77 |
| 2016/0056241 | A1* | 2/2016 | Miyazaki | H01L 21/0465<br>438/285 |
| 2017/0186695 | A1* | 6/2017 | Moser | H10D 30/66 |

FOREIGN PATENT DOCUMENTS

| | | | | | |
|---|---|---|---|---|---|
| JP | 2000-269286 | A | | 9/2000 | |
| JP | 2003-142563 | A | | 5/2003 | |
| JP | 2009-44083 | A | | 2/2009 | |
| JP | 2009044083 | A | * | 2/2009 | H01L 21/66 |
| JP | 2015190826 | A | | 11/2015 | |
| JP | 2020068231 | A | | 4/2020 | |
| WO | 2010079543 | A1 | | 7/2010 | |

* cited by examiner

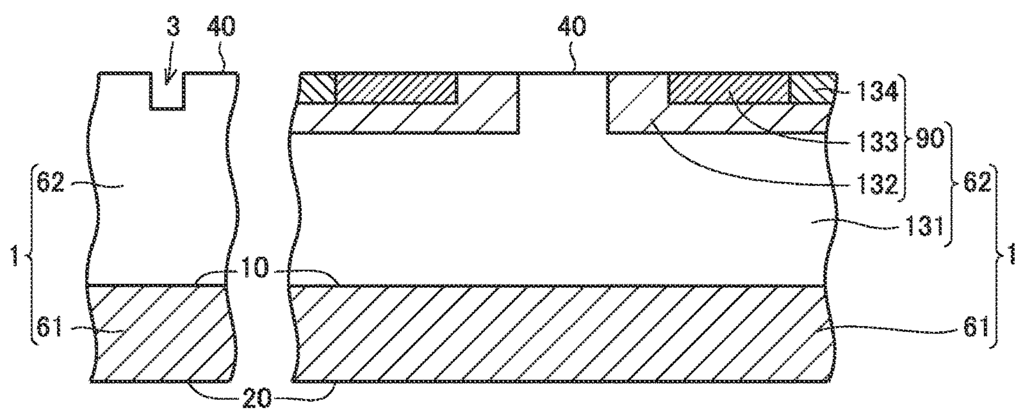

FIG.29

S41: FORMING FIRST SILICON CARBIDE EPITAXIAL FILM ON SILICON CARBIDE SINGLE-CRYSTAL SUBSTRATE

S42: FORMING REFERENCE MARK IN FIRST SILICON CARBIDE EPITAXIAL FILM

S43: SPECIFYING POSITION COORDINATES OF DEFECT IN FIRST SILICON CARBIDE EPITAXIAL FILM BASED ON REFERENCE MARK

S44: FORMING SECOND SILICON CARBIDE EPITAXIAL FILM ON FIRST SILICON CARBIDE EPITAXIAL FILM

S45: SPECIFYING POSITION COORDINATES OF DEFECT IN SECOND SILICON CARBIDE EPITAXIAL FILM BASED ON REFERENCE MARK

S46: FORMING DEVICE ACTIVE REGION IN SECOND SILICON CARBIDE EPITAXIAL FILM

S47: SPECIFYING POSITION COORDINATES OF DEVICE ACTIVE REGION BASED ON REFERENCE MARK

S48: MAKING PASS/FAIL JUDGEMENT OF DEVICE ACTIVE REGION BY ASSOCIATING POSITION COORDINATES OF DEFECT WITH POSITION COORDINATES OF DEVICE ACTIVE REGION

METHOD OF MANUFACTURING SILICON CARBIDE SUBSTRATE, SILICON CARBIDE SINGLE-CRYSTAL SUBSTRATE AND SILICON CARBIDE SEMICONDUCTOR DEVICE

TECHNICAL FIELD

The present disclosure relates to a silicon carbide substrate, a silicon carbide single-crystal substrate, and a method of manufacturing a silicon carbide semiconductor device. This application claims priority based on Japanese Patent Application No. 2020-169062 filed on Oct. 6, 2020, and the entire contents of the Japanese patent application are incorporated herein by reference. The entire contents described in the Japanese Patent Application are incorporated herein by reference.

BACKGROUND ART

Japanese Unexamined Patent Application Publication No. H4-62858 (PTL 1) describes a method for observing and analyzing foreign matter. In this method, coordinates system are established by providing coordinates reference on the wafer.

Japanese Unexamined Patent Application Publication No. 2000-269286 (PTL 2) describes a defect position specifying method for a semiconductor substrate. In this method, the position of the defect is specified based on the affine transformation and coordinates values in coordinates system of the defect evaluation apparatus.

CITATION LIST

Patent Literature

PTL 1: Japanese Unexamined Patent Application Publication No. H4-62858

PTL 2: Japanese Unexamined Patent Application Publication No. 2000-269286

SUMMARY OF INVENTION

A method of manufacturing a silicon carbide semiconductor device according to the present disclosure include the following steps. A reference mark serving as a reference of two dimensional position coordinates are formed in a silicon carbide substrate including a silicon carbide single-crystal substrate and a silicon carbide epitaxial film provided on the silicon carbide single-crystal substrate. After the forming the reference mark, at least one of polishing or cleaning is performed on a reference mark formation surface of the silicon carbide substrate. Position coordinates of a defect present in the silicon carbide substrate are specified based on the reference mark. A device active region is formed in the silicon carbide substrate. Position coordinates of the device active region are specified based on the reference mark. A pass/fail judgment of the device active region is made by associating the position coordinates of the defect with the position coordinates of the device active region.

A silicon carbide substrate according to the present disclosure includes a silicon carbide single-crystal substrate and a silicon carbide epitaxial film provided on the silicon carbide single-crystal substrate. The silicon carbide substrate includes: an outer peripheral edge; and a main surface surrounded by the outer peripheral edge. The main surface includes an outer peripheral region which is a region within 5 mm from the outer peripheral edge and a central region surrounded by the outer peripheral region, and a plurality of reference marks serving as references of two-dimensional position coordinates are provided in the outer peripheral region of the silicon carbide epitaxial film.

A silicon carbide single-crystal substrate according to the present disclosure includes: an outer peripheral edge; and a main surface surrounded by the outer peripheral edge. The main surface includes an outer peripheral region which is a region within 5 mm from the outer peripheral edge and a central region surrounded by the outer peripheral region. A plurality of reference marks serving as references of two dimensional position coordinates are provided in the outer peripheral region.

BRIEF DESCRIPTION OF DRAWINGS

FIG. 5 is an enlarged schematic plan view showing a configuration of a reference mark of a silicon carbide single-crystal substrate according to a second embodiment.

FIG. 6 is a schematic cross-sectional view taken along line VI-VI of FIG. 5.

FIG. 28 is a schematic cross-sectional view showing a step of forming a device active region in a silicon carbide epitaxial film.

FIG. 29 is a flow diagram schematically illustrating a method of manufacturing a silicon carbide semiconductor device according to a ninth embodiment.

DETAILED DESCRIPTION

Figure 1:
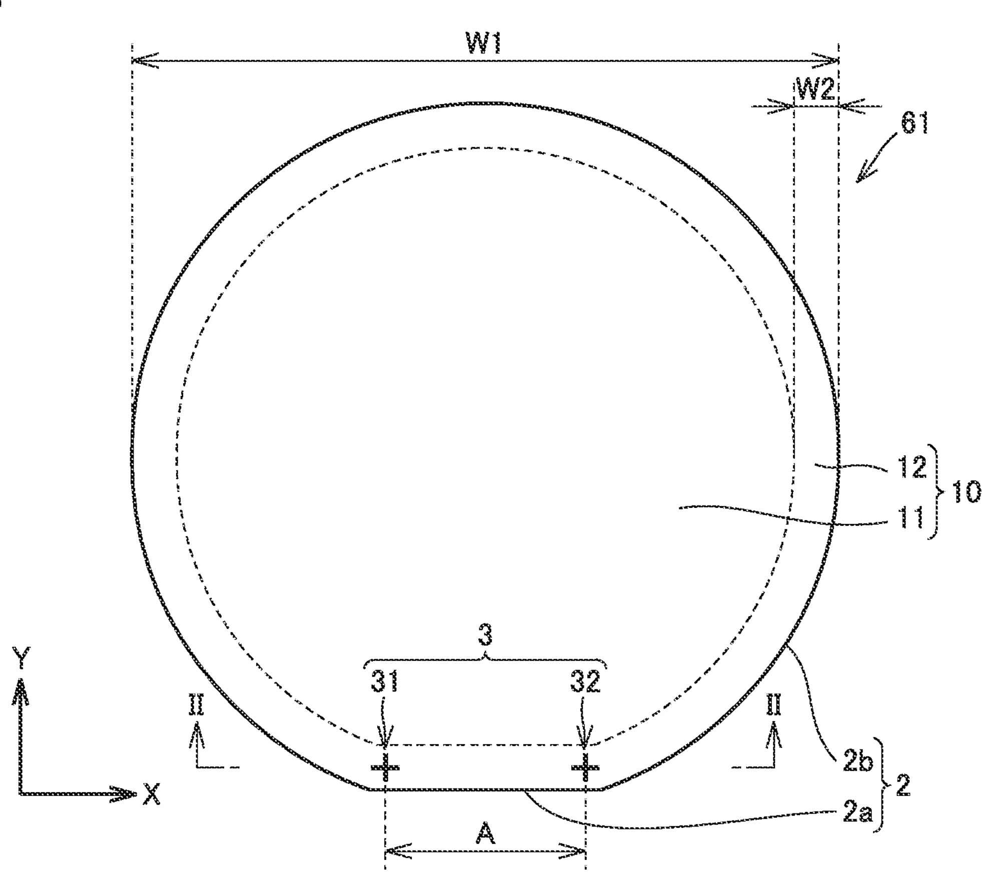
FIG. 1 is a schematic plan view showing a configuration of a silicon carbide single-crystal substrate according to a first embodiment.

Problem to be Solved by the Present Disclosure

An object of the present disclosure is to provide a silicon carbide substrate, a silicon carbide single-crystal substrate, and a method of manufacturing a silicon carbide semiconductor device, which can accurately determine pass/fail of a device active region.

Advantageous Effect of the Present Disclosure

According to the present disclosure, it is possible to provide a silicon carbide substrate, a silicon carbide single-crystal substrate, and a method of manufacturing a silicon carbide semiconductor device capable of accurately determining pass/fail of a device active region.

Summary of Embodiments of the Present Disclosure

First, an overview of embodiments of the present disclosure will be described.

(1) A method of manufacturing a silicon carbide semiconductor device 300 according to the present disclosure includes the following steps. A reference mark 3 serving as a reference of two dimensional position coordinates is formed in a silicon carbide substrate 1 including a silicon carbide single-crystal substrate 61 and a silicon carbide epitaxial film 62 provided on silicon carbide single-crystal substrate 61. After the forming reference mark 3, at least one of polishing or cleaning is performed on a reference mark formation surface of silicon carbide substrate 1. Based on reference mark 3, position coordinates of a defect 80 present in silicon carbide substrate 1 are specified. A device active region 90 is formed in silicon carbide substrate 1. Position coordinates of device active region 90 are specified based on reference mark 3. A pass/fail judgment of device active region 90 is made by associating the position coordinates of defect 80 with the position coordinates of device active region 90. Polishing of the reference mark formation surface may be performed only on the reference mark formation surface (single-sided polishing), or may be performed on both the reference mark formation surface and a surface opposite to the reference mark formation surface (double-sided polishing).

According to the method of manufacturing silicon carbide semiconductor device 300 in (1), the position coordinates of defect 80 in silicon carbide substrate 1 are specified based on reference mark 3. Device active region 90 is formed in silicon carbide substrate 1. The position coordinates of device active region 90 are specified based on reference mark 3. The pass/fail judgment of device active region 90 is made by associating the position coordinates of defect 80 with the position coordinates of device active region 90. By associating the position coordinates of defect 80 with the position coordinates of device active region 90 using the common coordinates using the reference mark 3, it is possible to accurately specify a defective device caused by defect 80. Therefore, it is possible to accurately determine pass/fail of device active region 90.

In addition, before silicon carbide semiconductor device 300 is completed, the failure rate of the device due to defect 80 can be accurately estimated. Based on the failure rate of the device, the device structure or device arrangement can be optimally designed.

(2) According to the method of manufacturing silicon carbide semiconductor device 300 described in (1), in the forming device active region 90 in silicon carbide substrate 1, a formation position of device active region 90 may be adjusted based on the position coordinates of defect 80. Thus, device active region 90 can be formed so as to avoid defect 80. Therefore, the yield of the device can be improved.

(3) According to the method of manufacturing silicon carbide semiconductor device 300 described in (1) or (2), reference mark 3 may be provided in silicon carbide single-crystal substrate 61. Device active region 90 may be provided in silicon carbide epitaxial film 62. When reference mark 3 is provided in silicon carbide single-crystal substrate 61, it is desirable to perform polishing processing on the reference mark formation surface and then perform cleaning on the reference mark formation surface in order to remove unevenness, distortion, foreign matter such as dust, and dirt in the vicinity of the reference mark due to processing after the reference mark is formed. The polishing process may be performed only on the reference mark formation surface, or may be performed on both the reference mark formation surface and the surface opposite to the reference mark formation surface.

Only a region of silicon carbide epitaxial film 62 provided on reference mark 3 may be removed by etching or the like until the silicon carbide single-crystal substrate 61 is exposed. Since reference mark 3 provided on the silicon carbide single-crystal substrate 61 is exposed by etching or the like, reference mark 3 can be more accurately determined. The etching of silicon carbide epitaxial film 62 may be performed until the silicon carbide single-crystal substrate 61 is exposed, or may be stopped before the silicon carbide single-crystal substrate 61 is exposed. When the etching is stopped before the silicon carbide single-crystal substrate 61 is exposed, silicon carbide epitaxial film 62 may remain on reference mark 3.

(4) According to the method of manufacturing silicon carbide semiconductor device 300 described in (1) or (2), each of reference mark 3 and device active region 90 may be provided in silicon carbide epitaxial film 62. When reference mark 3 is formed in silicon carbide epitaxial film 62, polishing or cleaning may be performed on the reference mark formation surface after forming reference mark 3.

(5) According to the method of manufacturing silicon carbide semiconductor device 300 described in any of (1) to (4), reference mark 3 may be formed by laser machining. If reference mark 3 is an indentation, dust may be generated when reference mark 3 is formed. Since reference mark 3 is formed by laser machining, generation of dust can be suppressed. Therefore, the yield of the device can be further improved. When reference mark 3 is an indentation, it is difficult to form reference mark 3 deeply. Therefore, if a polishing process is performed on the reference mark formation surface in order to remove irregularities and distortion in the vicinity of the reference mark generated when reference mark 3 is processed, reference mark 3 may disappear. In this case, it is difficult to discriminate reference mark 3. Since reference mark 3 is formed by laser machining, reference mark 3 can be deeply formed. Therefore, polishing processing can be performed on the reference mark formation surface in order to remove unevenness or distortion in the vicinity of the reference mark generated when reference mark 3 is processed. Further, at the time of alignment, reference mark 3 can be accurately determined. Further, when reference mark 3 is an indentation, a crack may be generated in the substrate on which reference mark 3 is formed. Since reference mark 3 is formed by laser machining, the occurrence of cracks in the substrate can be suppressed.

When reference mark 3 is provided in silicon carbide single-crystal substrate 61, it is desirable to perform polishing processing on the reference mark formation surface and then perform cleaning on the reference mark formation surface in order to remove unevenness, distortion, foreign matter such as dust, and dirt in the vicinity of the reference mark due to processing after the reference mark is formed. The polishing process may be performed only on the reference mark formation surface, or may be performed on both the reference mark formation surface and the surface opposite to the reference mark formation surface. When reference mark 3 is formed in silicon carbide epitaxial film 62, polishing or cleaning may be performed on the reference mark formation surface after forming reference mark 3.

(6) According to the method of manufacturing silicon carbide semiconductor device 300 described in any of (1) to (4), reference mark 3 may be formed by etching. If reference mark 3 is an indentation, dust may be generated when reference mark 3 is formed. By forming reference mark 3 by etching, the generation of dust can be suppressed. Therefore, the yield of the device can be further improved. When reference mark 3 is an indentation, it is difficult to form reference mark 3 deeply. Therefore, if a polishing process is performed on the reference mark formation surface in order to remove irregularities and distortion in the vicinity of the reference mark generated when reference mark 3 is processed, reference mark 3 may disappear. In this case, it is difficult to discriminate reference mark 3. Since reference mark 3 is formed by etching, reference mark 3 can be formed deeply. Therefore, polishing processing can be performed on the reference mark formation surface in order to remove unevenness or distortion in the vicinity of the reference mark generated when reference mark 3 is processed. Further, at the time of alignment, reference mark 3 can be accurately discriminated. Further, when reference mark 3 is an indentation, a crack may be generated in the substrate on which reference mark 3 is formed. Since reference mark 3 is formed by etching, the occurrence of cracks in the substrate can be suppressed.

When reference mark 3 is provided in silicon carbide single-crystal substrate 61, it is desirable to perform polishing processing on the reference mark formation surface and then perform cleaning on the reference mark formation surface in order to remove unevenness, distortion, foreign matter such as dust, and dirt in the vicinity of the reference mark due to processing after the reference mark is formed. The polishing process may be performed only on the reference mark formation surface, or may be performed on both the reference mark formation surface and the surface opposite to the reference mark formation surface. When reference mark 3 is formed in silicon carbide epitaxial film 62, polishing or cleaning may be performed on the reference mark formation surface after forming reference mark 3.

(7) A silicon carbide substrate 1 according to the present disclosure is silicon carbide substrate 1 including a silicon carbide single-crystal substrate 61 and a silicon carbide epitaxial film 62 provided on silicon carbide single-crystal substrate 61, and includes an outer peripheral edge 2 and a main surface 10. Main surface 10 is surrounded by outer peripheral edge 2. Main surface 10 includes an outer peripheral region 12 which is a region within 5 mm from outer peripheral edge 2 and a central region 11 surrounded by outer peripheral region 12. A plurality of reference marks 3 serving as references for two-dimensional position coordinates are provided in outer peripheral region 12 of silicon carbide epitaxial film 62. Thus, as compared with the case where reference mark 3 is provided in central region 11, it is possible to secure a large area of the region where the device is formed.

(8) According to silicon carbide substrate 1 described in (7), when viewed in a direction perpendicular to main surface 10, a distance between the plurality of reference marks 3 may be 30 mm or more. Thus, the position coordinates of defect 80 can be specified with high accuracy.

(9) According to silicon carbide substrate 1 described in (7) or (8), when viewed in a direction perpendicular to main surface 10, a smallest imaginary circle surrounding each of the plurality of reference marks 3 may have a diameter of more than 10 μm and less than 3 mm. This makes it possible to accurately determine reference mark 3 during alignment.

(10) According to silicon carbide substrate 1 described in any of (7) to (9), it is desirable that a depth of each of the plurality of reference marks 3 in the direction perpendicular to main surface 10 is about 1/10 to 10 times the thickness of silicon carbide epitaxial film 62. Each of the plurality of reference marks 3 may have, for example, a depth of more than 0.5 μm and less than 100 μm in a direction perpendicular to main surface 10. In the case where reference mark 3 is provided in silicon carbide single-crystal substrate 61, by forming reference mark 3 having the above-described depth, reference mark 3 can be accurately determined during alignment even if the shape of reference mark 3 which is carried over to silicon carbide epitaxial film 62 and formed is somewhat deformed due to the growth conditions (for example, growth temperature and C/Si ratio) of silicon carbide epitaxial film 62.

(11) According to silicon carbide substrate 1 described in any of (7) to (10), each of the plurality of reference marks 3 may have a cross shape when viewed in a direction perpendicular to main surface 10. This makes it possible to accurately determine reference mark 3 during alignment.

(12) A silicon carbide single-crystal substrate 61 according to the present disclosure includes an outer peripheral edge 2 and a main surface 10 surrounded by outer peripheral edge 2. Main surface 10 includes an outer peripheral region 12 which is a region within 5 mm from outer peripheral edge 2 and a central region 11 surrounded by outer peripheral region 12. A plurality of reference marks 3 serving as references of two-dimensional position coordinates are provided in outer peripheral region 12.

(13) According to silicon carbide single-crystal substrate 61 described in (12), a distance between the plurality of reference marks 3 may be 30 mm or more when viewed in a direction perpendicular to main surface 10.

(14) According to silicon carbide single-crystal substrate 61 described in (12) or (13), a smallest imaginary circle surrounding each of the plurality of reference marks 3 may have a diameter of more than 10 μm and less than 3 mm when viewed in a direction perpendicular to main surface 10.

(15) According to silicon carbide single-crystal substrate 61 described in any of (12) to (14), each of the plurality of reference marks 3 may have a depth of more than 0.5 μm and less than 100 μm in a direction perpendicular to main surface 10.

(16) According to silicon carbide single-crystal substrate 61 described in any of (12) to (15), each of the plurality of reference marks 3 may have a cross shape when viewed in a direction perpendicular to main surface 10.

DETAILS OF EMBODIMENTS OF THE PRESENT DISCLOSURE

Hereinafter, details of embodiments of the present disclosure (hereinafter also referred to as the present embodiments) will be described below with reference to the drawings. In the following drawings, the same or corresponding parts are denoted by the same reference numerals, and description thereof will not be repeated.

First Embodiment

First, a configuration of silicon carbide single-crystal substrate 61 according to the first embodiment will be described.

FIG. 1 is a schematic plan view showing the configuration of silicon carbide single-crystal substrate 61 according to the first embodiment. As shown in FIG. 1, silicon carbide single-crystal substrate 61 according to the first embodiment mainly has first main surface 10 and outer peripheral edge 2. First main surface 10 is surrounded by outer peripheral edge 2. First main surface 10 includes central region 11 and outer peripheral region 12. Outer peripheral region 12 is a region within 5 mm from outer peripheral edge 2. Central region 11 is surrounded by outer peripheral region 12. First main surface 10 is composed of central region 11 and outer peripheral region 12. In the radial direction of first main surface 10, a gap W2 between the boundary between central region 11 and outer peripheral region 12 and outer peripheral edge 2 is 5 mm.

Outer peripheral edge 2 has, for example, an orientation flat 2*a* and an arc-shaped portion 2*b*. Orientation flat 2*a* extends along a first direction X. As shown in FIG. 1, orientation flat 2*a* is linear when viewed in a direction perpendicular to first main surface 10. Arc-shaped portion 2*b* is connected with orientation flat 2*a*. Arc-shaped portion 2*b* is arc-shaped when viewed in a direction perpendicular to first main surface 10.

As shown in FIG. 1, when viewed in a direction perpendicular to first main surface 10, first main surface 10 extends along each of first direction X and a second direction Y. When viewed in a direction perpendicular to first main surface 10, second direction Y is a direction perpendicular to first direction X.

First direction X is, for example, a <11-20> direction. First direction X may be, for example, a [11-20] direction. First direction X may be a direction obtained by projecting the <11-20> direction onto first main surface 10. From another point of view, first direction X may be, for example, a direction including the <11-20> direction component.

Second direction Y is, for example, a <1-100> direction. Second direction Y may be, for example, a [1-100]. Second direction Y may be, for example, a direction obtained by projecting the <1-100> direction onto first main surface 10. From another point of view, second direction Y may be, for example, a direction including the <1-100> direction component.

First main surface 10 may be a {0001} plane, or may be a plane inclined with respect to the {0001} plane. When first main surface 10 is inclined with respect to the {0001} plane, the inclination angle (off angle) with respect to the {0001} plane is, for example, 1 degree or more and 8 degree or less. When first main surface 10 is inclined with respect to the {0001} plane, the inclination direction (off direction) of first main surface 10 is, for example, the <11-20> direction.

A maximum diameter W1 of first main surface 10 is, for example, 100 mm (4 inches) or more. Maximum diameter W1 of first main surface 10 may be 150 mm (6 inches) or more, or 200 mm (8 inches) or more. The upper limit of maximum diameter W1 of first main surface 10 is not particularly limited, but may be 400 mm (16 inches) or less, for example. Maximum diameter W1 of first main surface 10 is the longest straight line distance between two different points on outer peripheral edge 2.

In the specification, 4 inches refers to 100 mm or 101.6 mm (4 inches×25.4 mm/inch). 6 inches refers to 150 mm or 152.4 mm (6 inches×25.4 mm/inch). 8 inches refers to 200 mm or 203.2 mm (8 inches×25.4 mm/inch). 16 inches refers to 400 mm or 406.4 mm (16 inches×25.4 mm/inch).

As shown in FIG. 1, a plurality of reference marks 3 are provided in outer peripheral region 12. Each of the plurality of reference marks 3 is a reference of two dimensional position coordinates. As shown in FIG. 1, when viewed in a direction perpendicular to first main surface 10, each of the plurality of reference marks 3 may be located within 5 mm from the orientation flat (outer peripheral region 12). The number of reference marks 3 is not particularly limited, but is two, for example.

As shown in FIG. 1, when viewed in a direction perpendicular to first main surface 10, a distance A between each of the plurality of reference marks 3 is, for example, 30 mm or more. The lower limit of distance A between each of the plurality of reference marks 3 is not particularly limited, but may be 40 mm or more or 50 mm or more, for example. The upper limit of distance A between each of the plurality of reference marks 3 is not particularly limited, but may be 200 mm or less or 150 mm or less, for example.

As shown in FIG. 1, when viewed in a direction perpendicular to first main surface 10, each of the plurality of reference marks 3 may have a cross shape. The plurality of reference marks 3 include, for example, a first reference mark 31 and a second reference mark 32. Distance A between the plurality of reference marks 3 is a distance from the center of first reference mark 31 to the center of second reference mark 32. When reference mark 3 has a cross shape, distance A between the plurality of reference marks 3 is a distance from the center of the cross shape of first reference mark 31 to the center of the cross shape of second reference mark 32.

Figure 2:
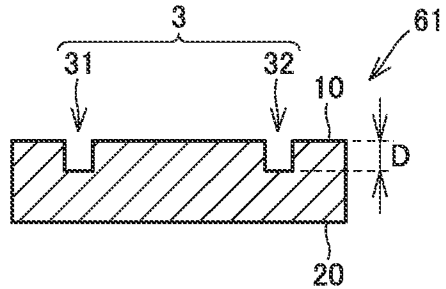
FIG. 2 is a schematic cross-sectional view taken along line II-II of FIG. 1.

FIG. 2 is a schematic cross-sectional view taken along line II-II of FIG. 1. As shown in FIG. 2, silicon carbide single-crystal substrate 61 has a second main surface 20 opposite to first main surface 10. Each of the plurality of reference marks 3 is, for example, a recess. In a direction perpendicular to first main surface 10, the bottom surface of the recess is located between first main surface 10 and second main surface 20.

In a direction perpendicular to first main surface 10, a depth D of each of the plurality of reference marks 3 is, for example, more than 0.5 μm and less than 100 μm. The lower limit of depth D of each of the plurality of reference marks 3 is not particularly limited, but may be, for example, 3 μm or more or 5 μm or more. The upper limit of depth D of each of the plurality of reference marks 3 is not particularly limited, but may be, for example, 50 μm or less, or 30 μm or less.

The polytype of silicon carbide constituting silicon carbide single-crystal substrate 61 is, for example, 4H. The polytype of silicon carbide constituting silicon carbide single-crystal substrate 61 may be, for example, 6H. Silicon carbide single-crystal substrate 61 has a thickness of 350 μm to 500 μm, for example. Silicon carbide single-crystal substrate 61 contains an n-type impurity such as nitrogen (N). The conductivity type of silicon carbide single-crystal substrate 61 is, for example, n type.

Figure 3:
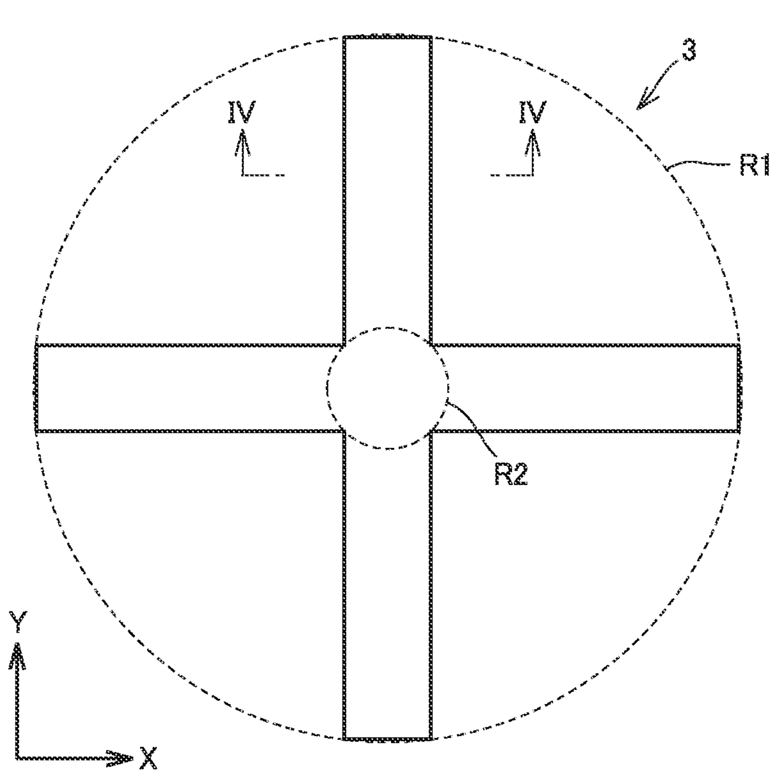
FIG. 3 is an enlarged plan view showing the construction of a reference mark.
Figure 4:
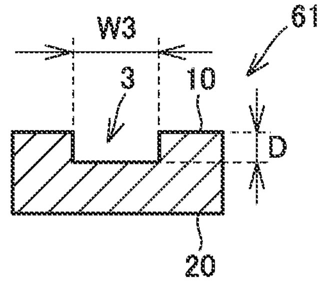
FIG. 4 is a schematic cross-sectional view taken along line IV-IV of FIG. 3.

FIG. 3 is an enlarged plan view showing the construction of reference mark 3. When viewed in a direction perpendicular to first main surface 10, the shape of reference mark 3 is, for example, axially symmetrical. The shape of reference mark 3 is, for example, a cross shape. For example, two rectangles may be provided so as to intersect perpendicularly at the center. FIG. 4 is a schematic cross-sectional view taken along line IV-IV of FIG. 3. As shown in FIG. 4, the length of the short side of the rectangle (a third length W3) may be more than depth D of reference mark 3. Third length W3 is, for example, 10 μm.

The shape of reference mark 3 is not limited to the cross shape. The shape of reference mark 3 may be a polygon, an axially symmetric rectangle (rectangle, square), or a circle. Reference mark 3 has a shape that can be surrounded by an imaginary circle, for example. The minimum imaginary circle surrounding reference mark 3 is, for example, a circumscribed circle of reference mark 3. The center of reference mark 3 is the center of the circumscribed circle.

When viewed in a direction perpendicular to first main surface 10, the radius of the smallest imaginary circle (a first imaginary circle R1) enclosing each of the plurality of reference marks 3 is, for example, more than 10 μm and less than the 3 mm. The lower limit of the radius of first imaginary circle R1 is not particularly limited, but may be, for example, 50 μm or more, or 100 μm or more. The upper limit of the radius of first imaginary circle R1 is not particularly limited, but may be, for example, 1 mm or less, or 0.5 mm or less.

As shown in FIG. 3, a second imaginary circle R2 encompassed by reference mark 3 is, for example, an inscribed circle of reference mark 3. The center of the inscribed circle of reference mark 3 may coincide with the center of the circumscribed circle of reference mark 3. When viewed in a direction perpendicular to first main surface 10, a radius of second imaginary circle R2 is, for example, less than 5 μm.

As shown in FIG. 1, a straight line passing through the center of first reference mark 31 and the center of second reference mark 32 is defined as the X-axis. A straight line parallel to first main surface 10 and perpendicular to the X-axis is defined as a Y-axis. An intermediate position between the center of first reference mark 31 and the center of second reference mark 32 is set as the origin of the two dimensional position coordinates, for example. The direction from the origin toward first reference mark 31 is, for example, the negative direction of the X-axis. The direction from the origin toward second reference mark 32 is, for example, the positive direction of the X-axis. The direction from the origin toward orientation flat 2*a* is, for example, the negative direction of the Y axis. The direction opposite to the direction from the origin toward orientation flat 2*a* is, for example, the positive direction of the Y axis. For example, as described above, the imaginary two dimensional position coordinates system is determined based on first reference mark 31 and second reference mark 32.

The position coordinates of defect 80 may be defined by a representative point such as a defect center, a figure such as a rectangle, a circle, or an ellipse surrounding the defect, or the like, using the imaginary two dimensional position coordinates system.

Second Embodiment

Next, a configuration of silicon carbide single-crystal substrate 61 according to the second embodiment will be described. Silicon carbide single-crystal substrate 61 according to the second embodiment is different from silicon carbide single-crystal substrate 61 according to the first embodiment mainly in that reference mark 3 is constituted by a plurality of recesses 30, and is the same as silicon carbide single-crystal substrate 61 according to the first embodiment in other respects. Hereinafter, a configuration different from silicon carbide single-crystal substrate 61 according to the first embodiment will be mainly described.

Figures 5, 6:
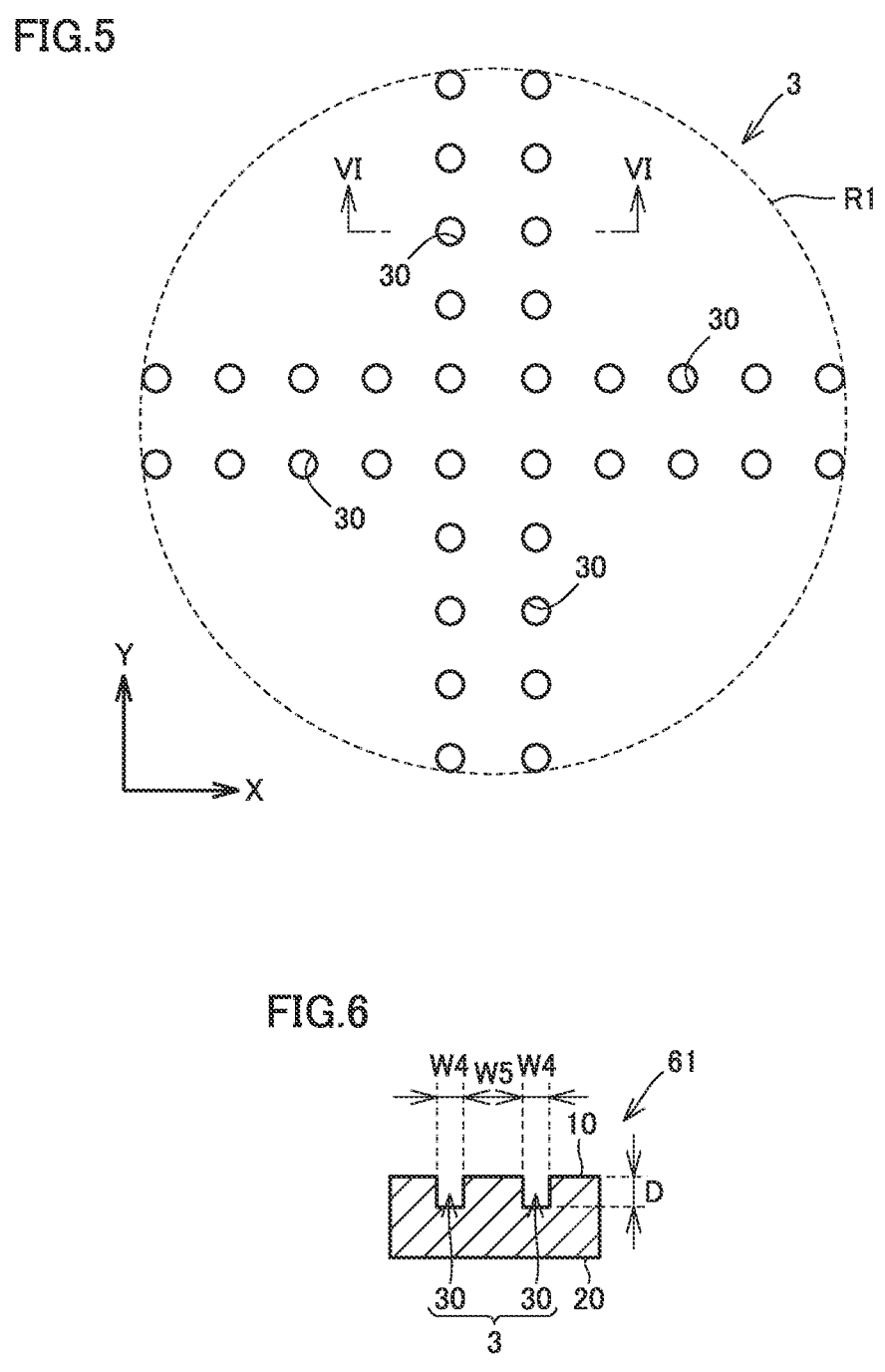

FIG. 5 is an enlarged schematic plan view showing a configuration of reference mark 3 of silicon carbide single-crystal substrate 61 according to the second embodiment. As shown in FIG. 5, reference mark 3 of silicon carbide single-crystal substrate 61 according to the second embodiment is constituted by a plurality of recesses 30. When viewed in a direction perpendicular to first main surface 10, the shape of each of the plurality of recesses 30 is, for example, circular. The plurality of recesses 30 are arranged, for example, at equal intervals along each of first direction X and second direction Y.

As shown in FIG. 5, for example, recesses 30 in two rows and ten columns and recesses 30 in ten rows and two columns may be provided so as to cross each other. FIG. 6 is a schematic cross-sectional view taken along line VI-VI of FIG. 5. As shown in FIG. 6, the width (a fifth width W5) of the region between two adjacent recesses may be more than the diameter (a fourth width W4) of each of the plurality of recesses 30.

Third Embodiment

Next, a configuration of silicon carbide single-crystal substrate 61 according to the third embodiment will be described. Silicon carbide single-crystal substrate 61 according to the third embodiment is different from silicon carbide single-crystal substrate 61 according to the first embodiment mainly in that reference mark 3 has a protruding shape, and is the same as silicon carbide single-crystal substrate 61 according to the first embodiment in other respects. Hereinafter, a configuration different from silicon carbide single-crystal substrate 61 according to the first embodiment will be mainly described.

Figure 7:
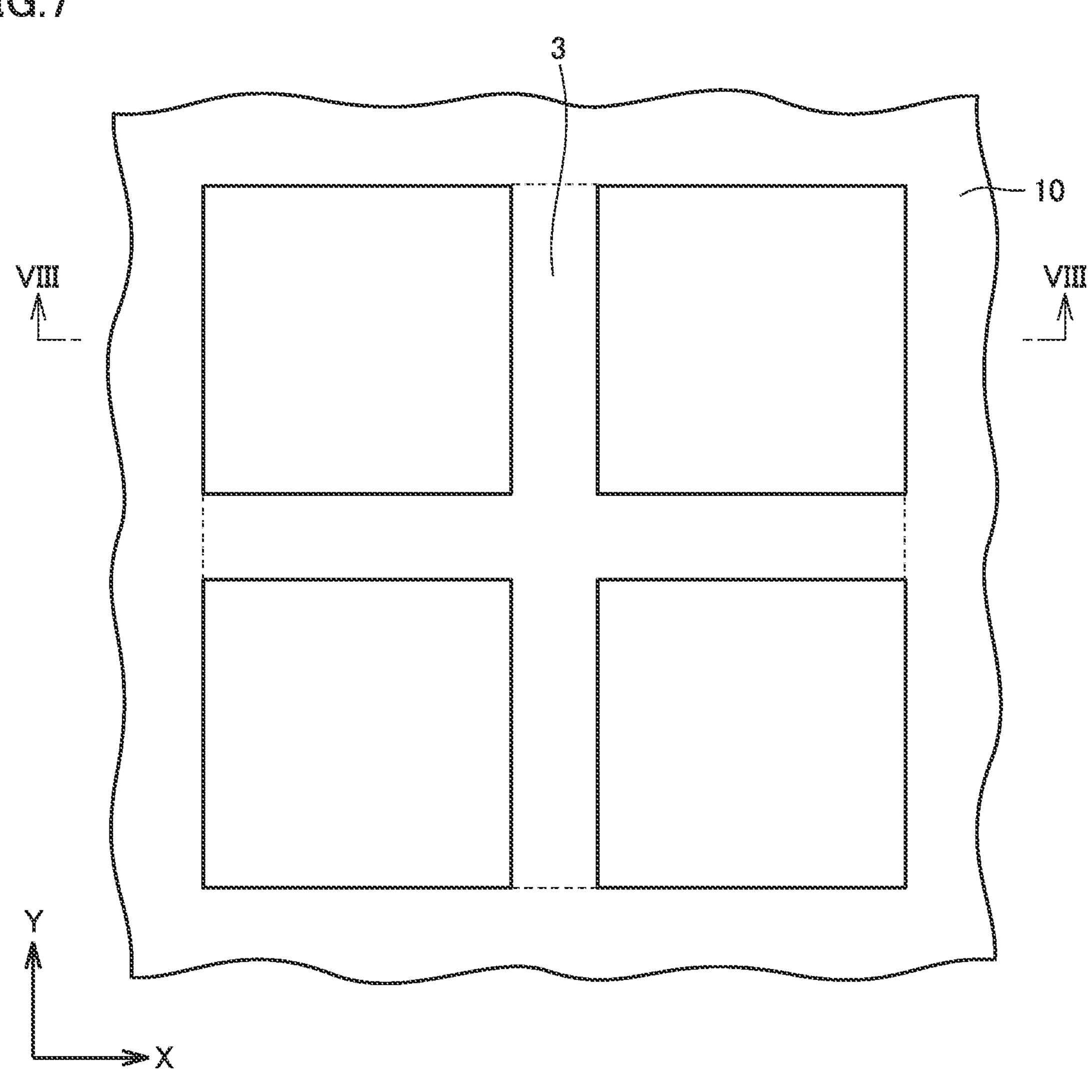
FIG. 7 is an enlarged schematic plan view showing a configuration of a reference mark of a silicon carbide single-crystal substrate according to a third embodiment.
Figure 8:
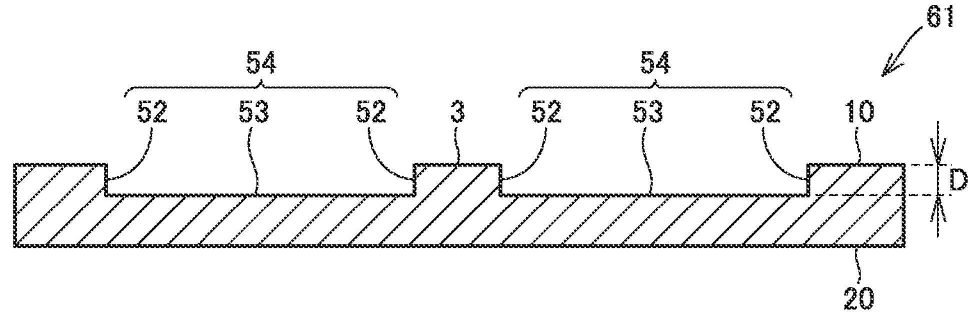
FIG. 8 is a schematic cross-sectional view taken along line VIII-VII of FIG. 7.

FIG. 7 is an enlarged schematic plan view showing a configuration of reference mark 3 of silicon carbide single-crystal substrate 61 according to the third embodiment. FIG. 8 is a schematic cross-sectional view taken along line VIII-VIII of FIG. 7. As shown in FIGS. 7 and 8, reference mark 3 may be protruding. Protruding reference mark 3 is, for example, a cross shape.

As shown in FIG. 8, a portion of protruding reference mark 3 is provided, for example, between two trenches 54. Each of two trenches 54 has a bottom surface 53 and a side surface 52. A part of side surface 52 of trench 54 constitutes the side surface of protruding reference mark 3. Depth D of trench 54 corresponds to the height of reference mark 3.

Fourth Embodiment

Next, a configuration of silicon carbide single-crystal substrate 61 according to the fourth embodiment will be described. Silicon carbide single-crystal substrate 61 according to the fourth embodiment is different from silicon carbide single-crystal substrate 61 according to the first embodiment mainly in the arrangement position of reference mark 3, and is the same as silicon carbide single-crystal substrate 61 according to the first embodiment in other respects. Hereinafter, a configuration different from silicon carbide single-crystal substrate 61 according to the first embodiment will be mainly described.

Figure 9:
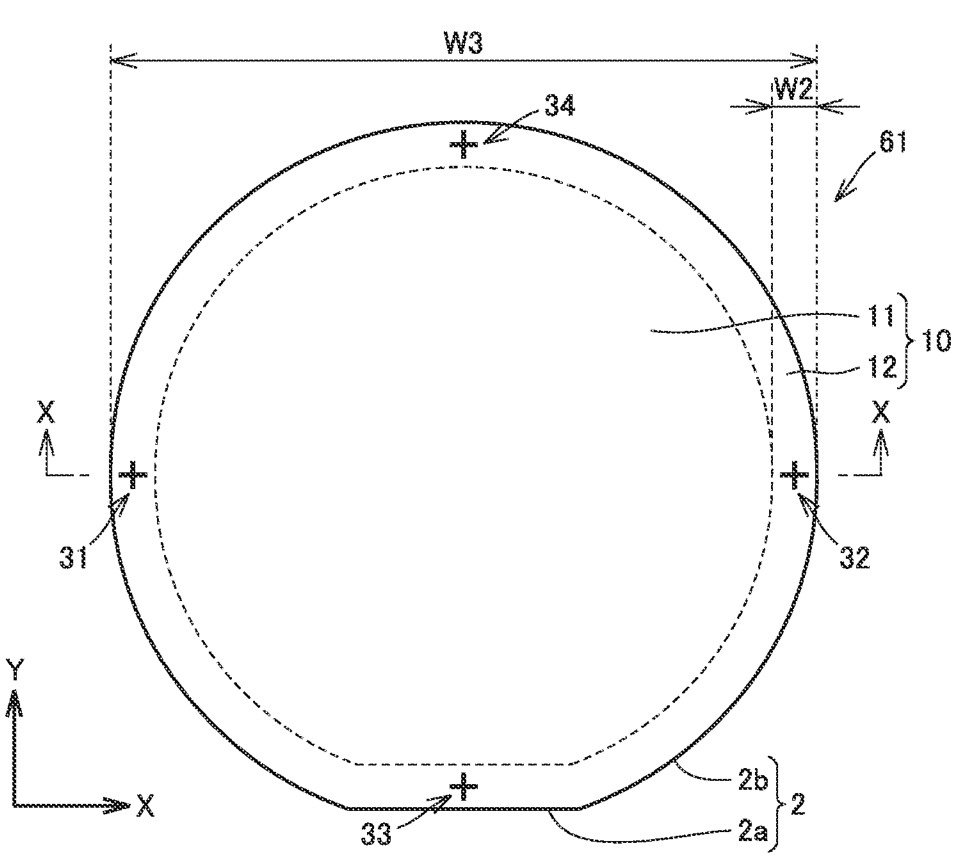
FIG. 9 is a schematic plan view showing a configuration of a silicon carbide single-crystal substrate according to a fourth embodiment.
Figure 10:
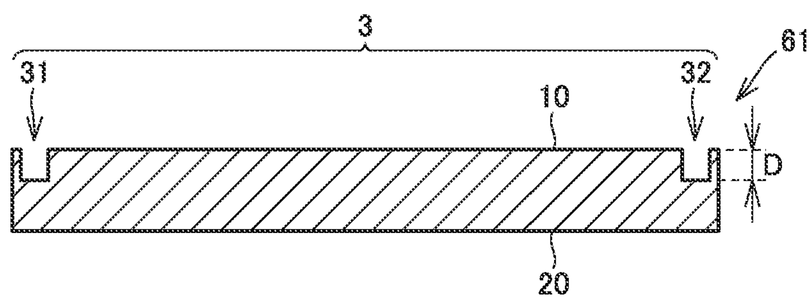
FIG. 10 is a schematic cross-sectional view taken along line X-X of FIG. 9.

FIG. 9 is a schematic plan view showing a configuration of a silicon carbide single-crystal substrate 61 according to the fourth embodiment. FIG. 10 is a schematic cross-sectional view taken along line X-X of FIG. 9. As shown in FIG. 9, the plurality of reference marks 3 include, for example, first reference mark 31, second reference mark 32, a third reference mark 33, and a fourth reference mark 34. Each of first reference mark 31, second reference mark 32, third reference mark 33, and fourth reference mark 34 is provided in outer peripheral region 12.

For example, a straight line (first straight line) passing through the center of first reference mark 31 and the center of second reference mark 32 is parallel to first direction X. For example, a straight line (second straight line) passing through the center of third reference mark 33 and the center of fourth reference mark 34 is parallel to second direction Y. For example, the first straight line is used as the X-axis of the two dimensional coordinates. For example, the second straight line is used as the Y axis of the two dimensional coordinates. For example, the intersection of the first straight line and the second straight line is used as the origin of the two dimensional coordinates. For example, as described above, the imaginary two dimensional position coordinates system may be determined based on first reference mark 31, second reference mark 32, third reference mark 33, and fourth reference mark 34.

Fifth Embodiment

Next, a configuration of silicon carbide substrate 1 according to the fifth embodiment will be described. Silicon carbide substrate 1 according to the fifth embodiment is different from silicon carbide single-crystal substrate 61 according to the first embodiment in that silicon carbide substrate 1 has silicon carbide single-crystal substrate 61 and silicon carbide epitaxial film 62, and is the same as silicon carbide single-crystal substrate 61 according to the first embodiment in other respects. Hereinafter, a configuration different from silicon carbide single-crystal substrate 61 according to the first embodiment will be mainly described.

Figure 11:
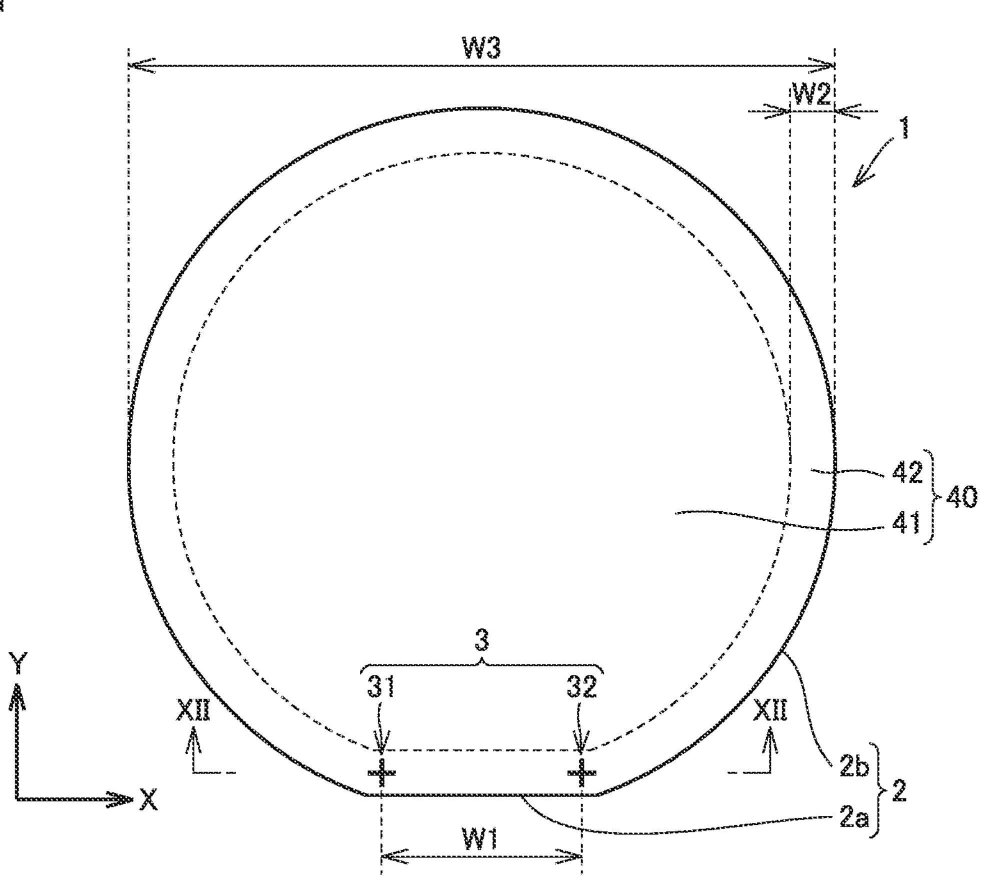
FIG. 11 is a schematic plan view showing a configuration of a silicon carbide substrate according to a fifth embodiment.
Figure 12:
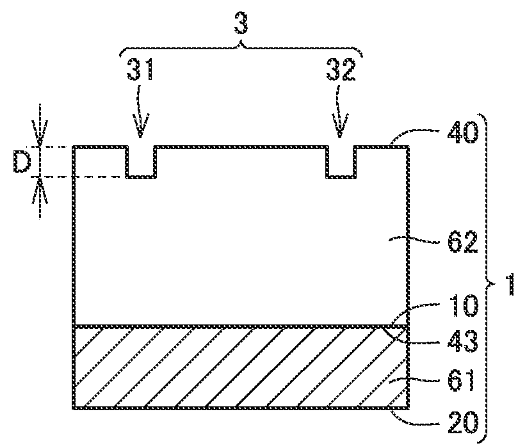
FIG. 12 is a schematic cross-sectional view taken along line XII-XII of FIG. 11.

FIG. 11 is a schematic plan view showing the configuration of silicon carbide substrate 1 according to the fifth embodiment. FIG. 12 is a schematic cross-sectional view taken along line XII-XII of FIG. 11. As shown in FIG. 12, silicon carbide substrate 1 has silicon carbide single-crystal substrate 61 and silicon carbide epitaxial film 62. Silicon carbide epitaxial film 62 is provided on silicon carbide single-crystal substrate 61. Silicon carbide epitaxial film 62 has a third main surface 43 and a fourth main surface 40. Third main surface 43 is in contact with silicon carbide single-crystal substrate 61. Fourth main surface 40 is opposite to third main surface 43.

As shown in FIG. 11, fourth main surface 40 has a central region 41 and an outer peripheral region 42. Outer peripheral region 42 is a region within 5 mm from outer peripheral edge 2. Outer peripheral region 42 surrounds central region 41. Each of the plurality of reference marks 3 is provided in outer peripheral region 42 of fourth main surface 40. The plurality of reference marks 3 includes first reference mark 31 and second reference mark 32. As shown in FIG. 12, each of the plurality of reference marks 3 is provided in silicon carbide epitaxial film 62.

For example, the polytype of silicon carbide constituting each of silicon carbide single-crystal substrate 61 and silicon carbide epitaxial film 62 is 4H. For example, the polytype of silicon carbide constituting each of silicon carbide single-crystal substrate 61 and silicon carbide epitaxial film 62 may be 6H. For example, silicon carbide single-crystal substrate 61 has a thickness of 350 μm to 500 μm. For example, silicon carbide epitaxial film 62 has a thickness of 1 μm to 100 μm.

For example, silicon carbide single-crystal substrate 61 and silicon carbide epitaxial film 62 each contain an n-type impurity such as nitrogen (N). The conductivity type of each of silicon carbide single-crystal substrate 61 and silicon carbide epitaxial film 62 is, for example, n-type. Silicon carbide single-crystal substrate 61 may be a conductive substrate or a semi-insulating substrate. Silicon carbide epitaxial film 62 may be an epitaxial film having a homo-structure or an epitaxial film having a hetero-structure. Silicon carbide epitaxial film 62 may be formed of one layer or two or more layers.

Sixth Embodiment

Next, a method of manufacturing silicon carbide semiconductor device 300 according to the sixth embodiment will be described.

Figure 13:
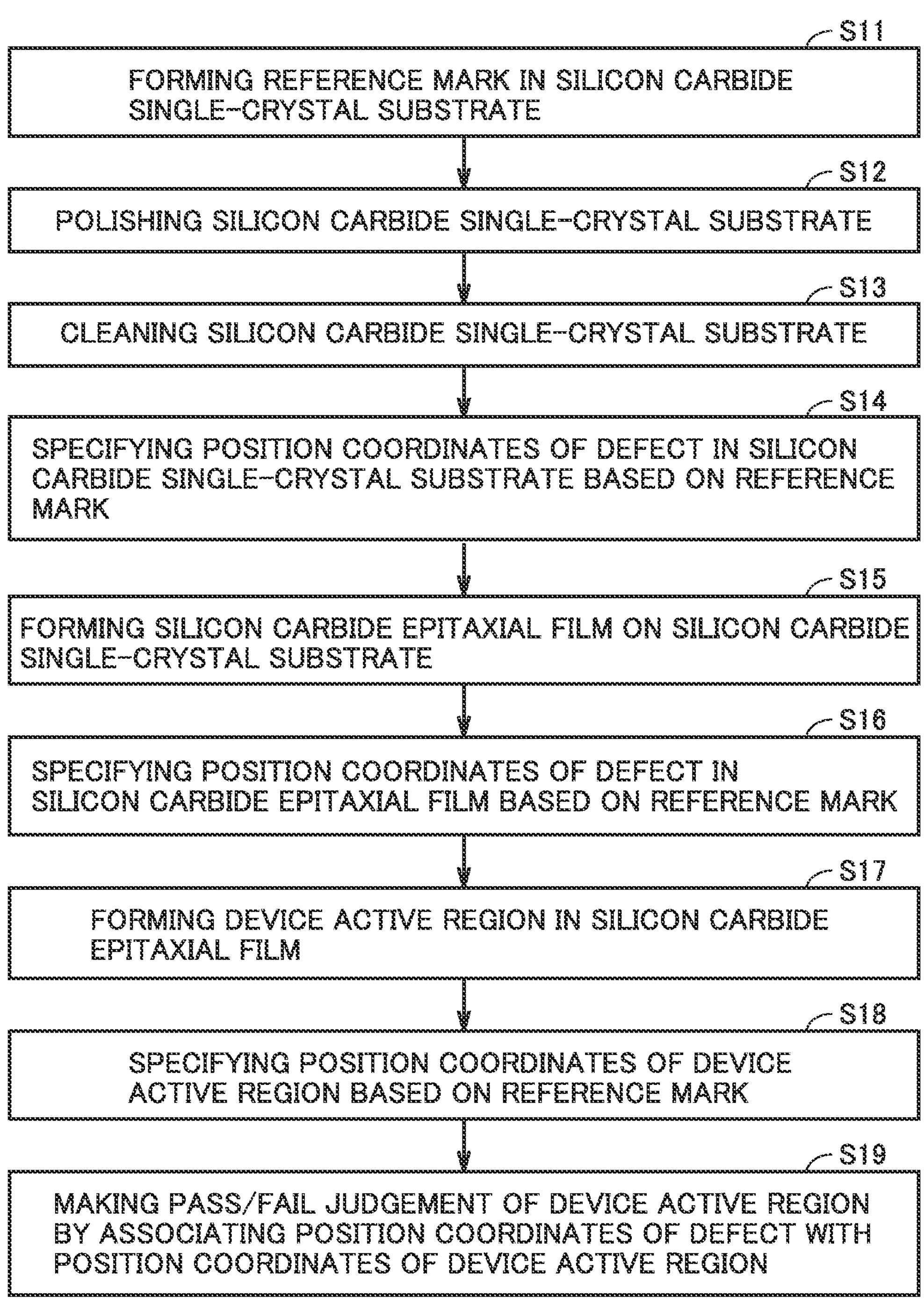
FIG. 13 is a flow diagram schematically illustrating a method of manufacturing a silicon carbide semiconductor device according to a sixth embodiment.

FIG. 13 is a flow diagram schematically illustrating a method of manufacturing silicon carbide semiconductor device 300 according to the sixth embodiment. As shown in FIG. 13, the method of manufacturing silicon carbide semiconductor device 300 according to the sixth embodiment mainly includes the steps of forming a reference mark in a silicon carbide single-crystal substrate (S11), polishing the silicon carbide single-crystal substrate (S12), cleaning the silicon carbide single-crystal substrate (S13), specifying the position coordinates of a defect in the silicon carbide single-crystal substrate based on the reference mark (S14), forming a silicon carbide epitaxial film on the silicon carbide single-crystal substrate (S15), specifying the position coordinates of a defect in the silicon carbide epitaxial film based on the reference mark (S16), forming a device active region in the silicon carbide epitaxial film (S17), specifying the position coordinates of the device active region based on the reference mark (S18), and making a pass/fail judgement of the device active region by associating the position coordinates of the defect with the position coordinates of the device active region (S19).

First, a silicon carbide single crystal of polytype 4H is manufactured by, for example, a sublimation method. Next, silicon carbide single-crystal substrate 61 is prepared by slicing a silicon carbide single crystal with a wire saw, for example. Silicon carbide single-crystal substrate 61 has first main surface 10 and second main surface 20. Second main surface 20 is opposite to first main surface 10. First main surface 10 includes central region 11 and outer peripheral region 12. Outer peripheral region 12 surrounds central region 11.

Figure 14:
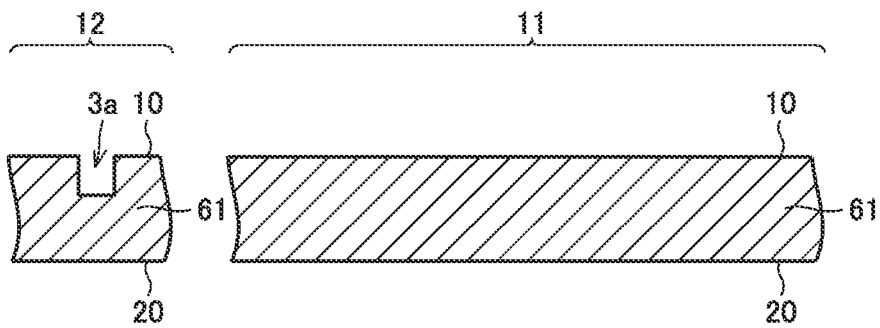
FIG. 14 is a schematic cross-sectional view showing a step of forming a reference mark in a silicon carbide single-crystal substrate.

Next, a step (S11) of forming a reference mark on the silicon carbide single-crystal substrate is performed. FIG. 14 is a schematic cross-sectional view showing a step of forming a reference mark on a silicon carbide single-crystal substrate. As shown in FIG. 14, reference mark 3 (a first mark 3*a*) is provided in outer peripheral region 12 of silicon carbide single-crystal substrate 61. As described above, reference mark 3 (first mark 3*a*) serving as a reference of the two dimensional position coordinates is formed on silicon carbide substrate 1. Silicon carbide single-crystal substrate 61 in which reference mark 3 is formed is, for example, the silicon carbide substrate according to the first embodiment to the fourth embodiment.

Next, a step (S12) of polishing the silicon carbide single-crystal substrate is performed. Specifically, silicon carbide single-crystal substrate 61 is subjected to a mechanical polishing step and a chemical mechanical polishing step. In the mechanical polishing step, diamond, for example, is used as abrasive grains. In the chemical mechanical polishing step, colloidal silica, for example, is used as abrasive grains. Polishing may be performed only on first main surface 10 of silicon carbide single-crystal substrate 61 (single-side polishing), or polishing may be performed on both first main surface 10 and second main surface 20 (double-side polishing). By removing unevenness and distortion in the vicinity of the reference mark by the polishing step and the cleaning step after the formation of the reference mark, the shape of reference mark 3 which is carried over to the silicon carbide epitaxial film and formed is prevented from being deformed. Therefore, reference mark 3 can be discriminated with high accuracy.

Next, a step (S13) of cleaning the silicon carbide single-crystal substrate is performed. Thus, residues and the like generated when reference mark 3 is formed in silicon carbide single-crystal substrate 61 are removed by cleaning. As described above, after reference mark 3 is formed, the reference mark formation surface of silicon carbide substrate 1 is polished, and then the reference mark formation surface is cleaned. The reference mark formation surface corresponds to first main surface 10. Although the case where both the step (S12) of polishing the silicon carbide single-crystal substrate and the step (S13) of cleaning the silicon carbide single-crystal substrate are performed has been described above, the embodiment of the present disclosure is not limited thereto. In the embodiment of the present disclosure, at least one of a step (S12) of polishing the silicon carbide single-crystal substrate and a step (S13) of cleaning the silicon carbide single-crystal substrate should be performed.

Figure 15:
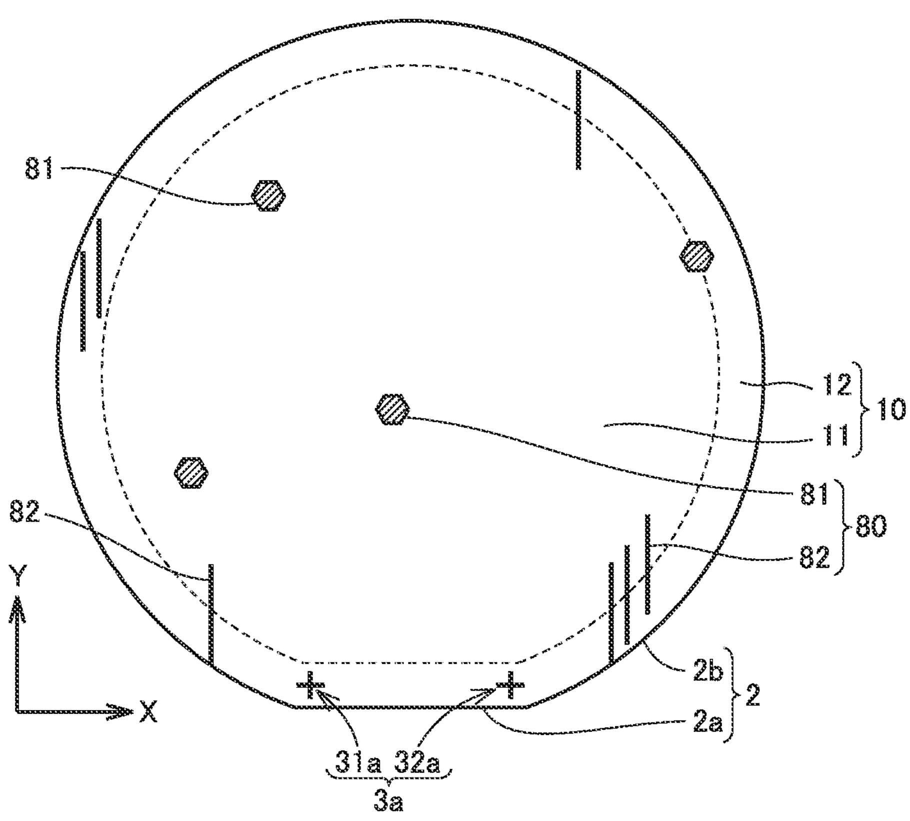
FIG. 15 is a schematic plan view showing a step of determining position coordinates of a defect in a silicon carbide single-crystal substrate based on a reference mark.

Next, a step (S14) of specifying position coordinates of a defect in the silicon carbide single-crystal substrate based on the reference mark is performed. In the step (S14), a defect in the silicon carbide single-crystal substrate is measured based on the reference mark, and its position coordinates are specified. FIG. 15 is a schematic plan view showing a step of specifying the position coordinates of defect 80 in silicon carbide single-crystal substrate 61 based on reference mark 3. As shown in FIG. 15, the plurality of reference marks 3 (first marks 3*a*) are provided in outer peripheral region 12 of silicon carbide single-crystal substrate 61. The plurality of reference marks 3 (first mark 3*a*) include a first reference mark 31*a* and a second reference mark 32*a*.

For example, a straight line passing through the center of first reference mark 31*a* and the center of second reference mark 32*a* is defined as the X-axis. A straight line parallel to first main surface 10 and perpendicular to the X-axis is defined as a Y-axis. An intermediate position between the center of first reference mark 31*a* and the center of second reference mark 32*a* is set as the origin of the two dimensional position coordinates, for example. The direction from the origin toward first reference mark 31*a* is, for example, the negative direction of the X-axis. The direction from the origin toward second reference mark 32*a* is, for example, the positive direction of the X-axis. The direction from the origin toward orientation flat 2*a* is, for example, the negative direction of the Y axis. The direction opposite to the direction from the origin toward orientation flat 2*a* is, for example, the positive direction of the Y axis. For example, as described above, the imaginary two dimensional position coordinates system is determined based on first reference mark 31*a* and second reference mark 32*a*.

As shown in FIG. 15, silicon carbide single-crystal substrate 61 has defect 80. Defect 80 includes, for example, a first defect 81 and a second defect 82. First defect 81 is, for example, a micropipe. Second defect 82 is, for example, a stacking fault. Defect 80 may be, for example, a threading helix dislocation, a threading edge dislocation, a basal plane dislocation, a carbon inclusion, or a deposit on the surface. Defect 80 may be located in central region 11 or may be located in outer peripheral region 12. Second defect 82 may be a scratch and the like.

The two dimensional position coordinates of defect 80 is specified using the imaginary two dimensional position coordinates system determined based on reference mark 3. For example, when first defects 81 exist on a plurality of coordinates including the first coordinates (X1, Y1), the plurality of coordinates including the first coordinates (X1, Y1) are specified as the two dimensional position coordinates of first defects 81. Similarly, when second defects 82 exist on a plurality of coordinates including the second coordinates (X2, Y2), for example, the plurality of coordinates including the second coordinates (X2, Y2) are specified as the two dimensional position coordinates of second defects 82. As described above, the position coordinates of defect 80 in silicon carbide substrate 1 is specified based on reference mark 3 (first mark 3*a*). The inspection method of defect 80 is, for example, a non-destructive inspection using a photoluminescence method, an X-ray diffraction method, a surface light scattering method, or a polarized transmitted light method.

Next, a step (S15) of forming the silicon carbide epitaxial film on the silicon carbide single-crystal substrate is performed. Specifically, silicon carbide single-crystal substrate 61 is disposed in a deposition chamber of a CVD (Chemical Vapor Deposition) apparatus, for example. Next, a source gas, a carrier gas, and a doping gas are introduced into the deposition chamber. The source gas includes, for example, silane ($SiH_4$) gas and propane ($C_3H_8$) gas. The carrier gas is, for example, hydrogen. The doping gas is, for example, ammonia gas or nitrogen gas.

Figure 16:
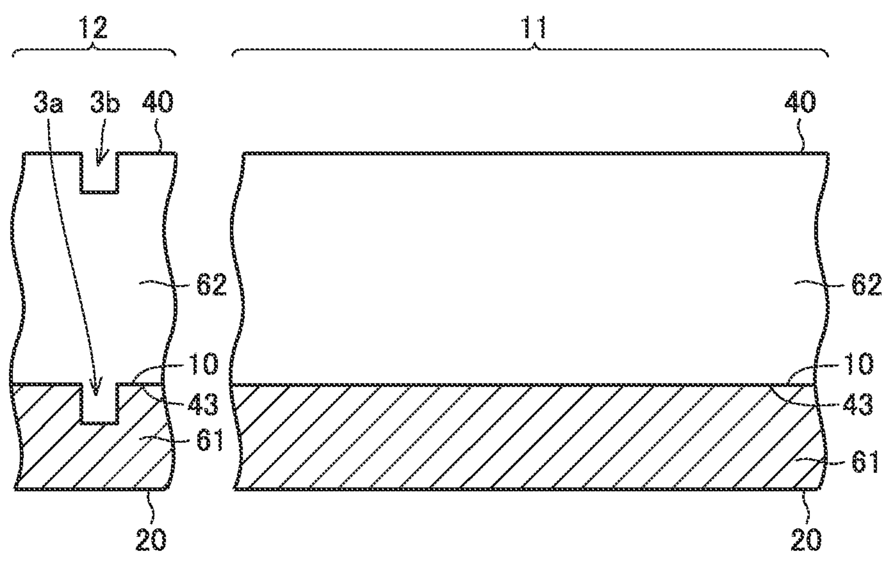
FIG. 16 is a schematic cross-sectional view showing a step of forming a silicon carbide epitaxial film on a silicon carbide single-crystal substrate.

FIG. 16 is a schematic cross-sectional view showing a step of forming silicon carbide epitaxial film 62 on silicon carbide single-crystal substrate 61. In the deposition chamber, the silane gas and the propane gas are thermally decomposed to form silicon carbide epitaxial film 62 on first main surface 10 of the silicon carbide single-crystal substrate 61. As shown in FIG. 16, silicon carbide epitaxial film 62 has third main surface 43 and fourth main surface 40. Third main surface 43 is in contact with silicon carbide single-crystal substrate 61.

As shown in FIG. 16, silicon carbide epitaxial film 62 in outer peripheral region 12 is formed to fill reference mark 3 (first mark 3*a*) formed in first main surface 10. As a result, reference mark 3 (a second mark 3*b*) is formed in outer peripheral region 12 of fourth main surface 40 of silicon carbide epitaxial film 62. Reference mark 3 (second mark 3*b*) formed in outer peripheral region 12 of fourth main surface 40 is directly above reference mark 3 (first mark 3*a*) formed in outer peripheral region 12 of first main surface 10. Second mark 3*b* is formed by carrying over first mark 3*a* to silicon carbide epitaxial film 62. The shape of second mark 3*b* is substantially the same as the shape of first mark 3*a*.

Reference mark 3 (first mark 3*a* and second mark 3*b*) is formed by, for example, laser machining. In laser machining, it is preferable to use, for example, a UV (ultraviolet) laser or a fiber laser. The wave length of the laser is preferably in the range from 100 nm to 1200 nm. The depth of reference mark 3 is, for example, more than 0.5 μm and less than 100 μm. If reference mark 3 is too shallow, it is difficult to visually recognize reference mark 3. If reference mark 3 is too deep, it is difficult to take out dust or dirt that has entered reference mark 3. In this case, a risk of contamination is likely to occur in the subsequent process.

It is preferable that reference mark 3 is formed not by one laser irradiation but by a plurality of laser irradiations. However, when the predetermined depth is reached by one laser irradiation, reference mark 3 may be formed by one laser irradiation. Further, when laser machining is performed while focusing on the machining surface, reference mark 3 can be machined with high accuracy.

Only a partial region of silicon carbide epitaxial film 62 provided on reference mark 3 (first mark 3*a*) may be removed by etching or the like until silicon carbide single-crystal substrate 61 is exposed. When reference mark 3 (first mark 3*a*) provided on silicon carbide single-crystal substrate 61 is exposed by etching or the like, reference mark 3 (first mark 3*a*) can be more accurately determined. The etching of silicon carbide epitaxial film 62 may be performed until the silicon carbide single-crystal substrate 61 is exposed, or may be stopped before the silicon carbide single-crystal substrate 61 is exposed. When the etching is stopped before the silicon carbide single-crystal substrate 61 is exposed, silicon carbide epitaxial film 62 may remain on reference mark 3 (first mark 3*a*).

Reference mark 3 (first mark 3*a* and second mark 3*b*) may be formed by etching, for example. In the etching process, for example, a mask pattern made of $SiO_2$ may be formed on silicon carbide single-crystal substrate 61 or silicon carbide epitaxial film 62 provided on silicon carbide single-crystal substrate 61, and a plasma etching process may be performed using an etching gas. It is effective to use $SF_6$ as the etching gas. The etching gas may include $O_2$ gas or $SiF_4$ in the $SF_6$. This makes it possible to form deep reference marks 3 (first mark 3*a* and second mark 3*b*).

Only a partial region of silicon carbide epitaxial film 62 provided on reference mark 3 (first mark 3*a*) may be removed by etching or the like until silicon carbide single-crystal substrate 61 is exposed. When reference mark 3 (first mark 3*a*) provided on silicon carbide single-crystal substrate 61 is exposed by etching or the like, reference mark 3 (first mark 3*a*) can be more accurately determined. The etching of silicon carbide epitaxial film 62 may be performed until the silicon carbide single-crystal substrate 61 is exposed, or may be stopped before the silicon carbide single-crystal substrate 61 is exposed. When the etching is stopped before the silicon carbide single-crystal substrate 61 is exposed, silicon carbide epitaxial film 62 may remain on reference mark 3 (first mark 3*a*).

Figure 17:
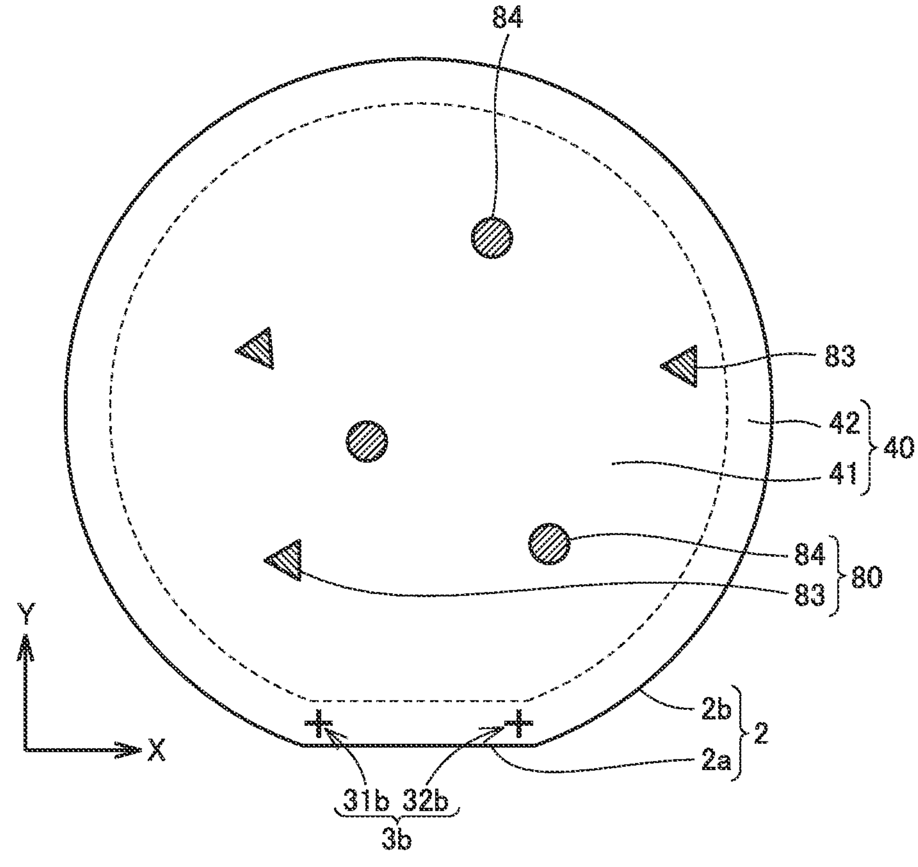
FIG. 17 is a schematic plan view showing a step of specifying position coordinates of a defect in a silicon carbide epitaxial film based on a reference mark.

Next, a step (S16) of specifying position coordinates of a defect of the silicon carbide epitaxial film based on the reference mark is performed. FIG. 17 is a schematic plan view showing a step of specifying the position coordinates of defect 80 in silicon carbide epitaxial film 62 based on reference mark 3. As shown in FIG. 17, a plurality of reference marks 3 (second marks 3*b*) are provided in outer peripheral region 12 of silicon carbide epitaxial film 62. The plurality of reference marks 3 (second marks 3*b*) include a first reference mark 31*b* and a second reference mark 32*b*.

For example, a straight line passing through the center of first reference mark 31*b* and the center of second reference mark 32*b* is taken as the X-axis. A straight line parallel to fourth main surface 40 and perpendicular to the X-axis is defined as a Y-axis. An intermediate position between the center of first reference mark 31*b* and the center of second reference mark 32*b* is set as the origin of the two dimensional position coordinates, for example. The direction from the origin toward first reference mark 31*b* is, for example, the negative direction of the X-axis. The direction from the origin toward second reference mark 32*b* is, for example, the positive direction of the X-axis. The direction from the origin toward orientation flat 2*a* is, for example, the negative direction of the Y axis. The direction opposite to the direction from the origin toward orientation flat 2*a* is, for example, the positive direction of the Y axis. For example, as described above, the imaginary two dimensional position coordinates system is determined based on first reference mark 31*b* and second reference mark 32*b*.

As shown in FIG. 17, defects 80 are present in fourth main surface 40 of silicon carbide epitaxial film 62. Defect 80 includes, for example, a third defect 83 and a fourth defect 84. Third defect 83 is, for example, a triangular defect. Fourth defect 84 is, for example, a downfall. Defect 80 may be, for example, a stacking fault, a carrot defect, a basal plane dislocation, or a surface deposit.

Next, a two dimensional position coordinates of defect 80 is specified by using the imaginary two dimensional position coordinates system determined based on reference mark 3 (second mark 3*b*). To be more specific, when third defect 83 exists on a plurality of coordinates including the third coordinates (X3, Y3), for example, the plurality of coordinates including the third coordinates (X3, Y3) are specified as the two dimensional position coordinates of third defect 83. Similarly, when fourth defect 84 exists on a plurality of coordinates including the fourth coordinates (X4, Y4), for example, the plurality of coordinates including the fourth coordinates (X4, Y4) are specified as the two dimensional position coordinates of fourth defect 84. As described above, the position coordinates of defect 80 in silicon carbide substrate 1 is specified based on reference mark 3 (second mark 3*b*).

Figure 18:
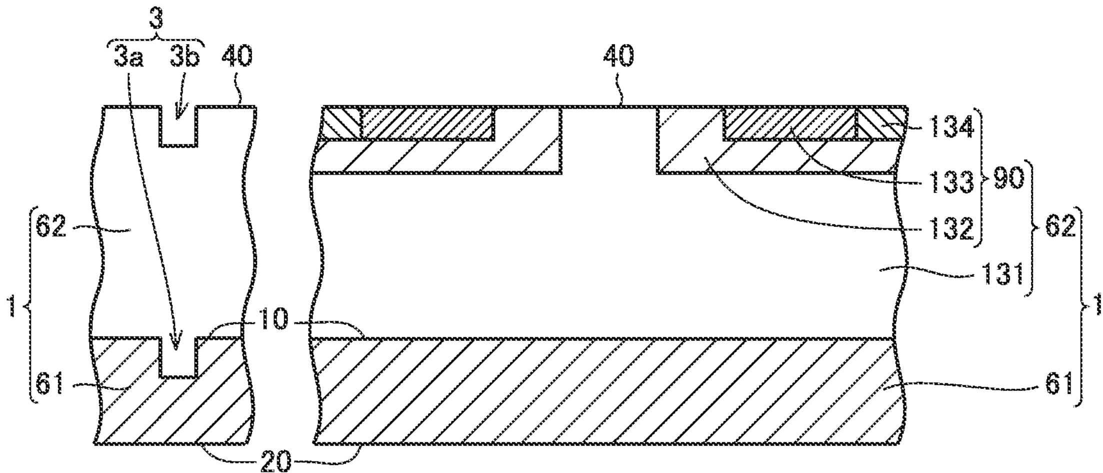
FIG. 18 is a schematic cross-sectional view showing a step of forming a device active region in a silicon carbide epitaxial film.

Next, a step (S17) of forming a device active region in the silicon carbide epitaxial film is performed. FIG. 18 is a schematic cross-sectional view showing a step of forming device active region 90 in silicon carbide epitaxial film 62. As shown in FIG. 18, a p-type impurity such as aluminum (Al) is implanted into silicon carbide epitaxial film 62. Thus, a body region 132 having a p-type conductivity type is formed. Next, an n-type impurity such as phosphorus (P) is implanted into a part of body region 132. Thus, a source region 133 having an n-type conductivity is formed. Next, a p-type impurity such as aluminum is implanted into a portion of source region 133. Thus, a contact region 134 having a p-type conductivity type is formed (see FIG. 18).

In silicon carbide epitaxial film 62, a portion other than body region 132, source region 133, and contact region 134 becomes a drift region 131. Source region 133 is separated from drift region 131 by body region 132. The ion implantation may be performed by heating silicon carbide substrate 1 to, for example, about 300° C. or more and 600° C. or less. After the ion implantation, activation annealing is performed on a silicon carbide epitaxial substrate 100. By the activation annealing, the impurities implanted into silicon carbide epitaxial film 62 are activated and carriers are generated in each region. The atmosphere of the activation annealing may be, for example, an argon (Ar) atmosphere. The temperature of the activation annealing may be, for example, about 1800° C. The time of activation annealing may be, for example, about 30 minutes.

Device active region 90 includes, for example, body region 132, source region 133, and contact region 134. As described above, device active region 90 is formed in silicon carbide substrate 1. Element active region 90 is provided in silicon carbide epitaxial film 62.

Next, a step (S18) of specifying the position coordinates of the device active region based on the reference mark is performed. Two dimensional position coordinates of device active region 90 is specified using the imaginary two dimensional position coordinates system determined based on reference mark 3 (second mark 3*b*). For example, when device active region 90 exists on a plurality of coordinates including the fifth coordinates (X5, Y5), the plurality of coordinates including the fifth coordinates (X5, Y5) are specified as the two dimensional position coordinates of device active region 90. As described above, the position coordinates of device active region 90 is specified based on reference mark 3.

Reference mark 3 in the step (S18) of specifying the position coordinates of the device active region based on the reference mark may be reference mark 3 (first mark 3*a*) formed in the step (S11) of forming the reference mark on the silicon carbide single-crystal substrate, or may be reference mark 3 (second mark 3*b*) formed in the step (S15) of forming the silicon carbide epitaxial film on the silicon carbide single-crystal substrate. Second mark 3*b* is formed by carrying over first mark 3*a* to silicon carbide epitaxial film 62. Therefore, the two dimensional position coordinates system determined based on first mark 3*a* is substantially the same as the two dimensional position coordinates system determined based on second mark 3*b*.

Figure 19:
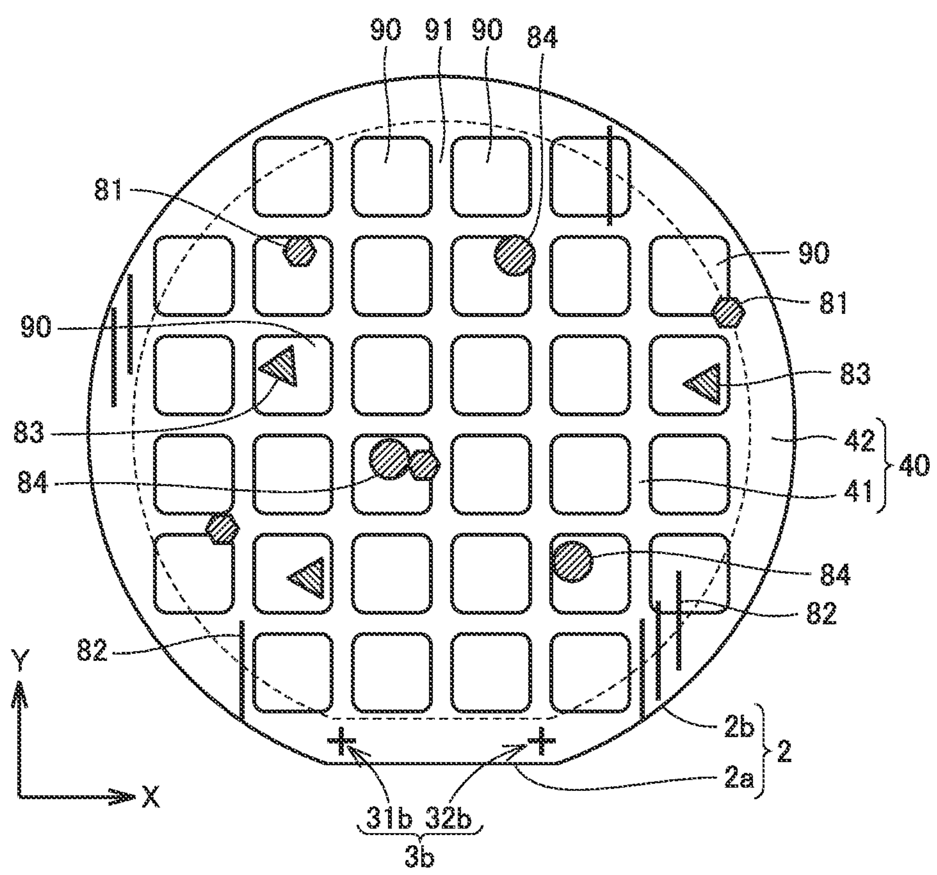
FIG. 19 is a schematic plan view showing a step of making a pass/fail judgment of the device active region.

Next, a step (S19) of making a pass/fail judgement of the device active region by associating the position coordinates of the defect with the position coordinates of the device active region is performed. FIG. 19 is a schematic plan view showing a step of making pass/fail judgment of the device active region. In FIG. 19, device active regions 90 are a plurality of regions indicated by generally square shapes. A dicing region 91 is provided between two adjacent device active regions 90. As shown in FIG. 19, the position coordinates of first defect 81, the position coordinates of second defect 82, the position coordinates of third defect 83, the position coordinates of fourth defect 84, and the position coordinates of device active region 90 may be mapped in a two dimensional plane.

Next, the position coordinates of first defect 81 are compared with the position coordinates of device active region 90. If the position coordinates of first defect 81 and the position coordinates of device active region 90 at least partially overlap, it means that first defect 81 exists in device active region 90. As shown in FIG. 19, some device active regions 90 among the plurality of device active regions 90 overlap with first defect 81. The semiconductor device formed in device active region 90 overlapping first defect 81 is determined as a defective product.

Similarly, the position coordinates of second defect 82 are compared with the position coordinates of device active region 90. If the position coordinates of second defect 82 and the position coordinates of device active region 90 at least partially overlap, it means that second defect 82 exists in device active region 90. As shown in FIG. 19, some device active regions 90 among the plurality of device active regions 90 overlap with second defect 82. The semiconductor device formed in device active region 90 overlapping second defect 82 is determined as a defective product.

Similarly, the position coordinates of third defect 83 are compared with the position coordinates of device active region 90. If the position coordinates of third defect 83 and the position coordinates of device active region 90 at least partially overlap, it means that third defect 83 exists in device active region 90. As shown in FIG. 19, some device active regions 90 among the plurality of device active regions 90 overlap with third defect 83. The semiconductor device formed in device active region 90 overlapping third defect 83 is determined as a defective product.

Similarly, the position coordinates of fourth defect 84 are compared with the position coordinates of device active region 90. If the position coordinates of fourth defect 84 and the position coordinates of device active region 90 at least partially overlap, it means that fourth defect 84 exists in device active region 90. As shown in FIG. 19, some device active regions 90 among the plurality of device active regions 90 overlap with fourth defect 84. The semiconductor device formed in device active region 90 overlapping fourth defect 84 is determined as a defective product.

When the position coordinates of device active region 90 does not overlap any of the position coordinates of first defect 81, the position coordinates of second defect 82, the position coordinates of third defect 83, and the position coordinates of fourth defect 84, each of first defect 81, second defect 82, third defect 83, and fourth defect 84 does not exist in device active region 90. As shown in FIG. 19, some of device active regions 90 do not overlap any of first defect 81, second defect 82, third defect 83, and fourth defect 84. A semiconductor device formed in device active region 90 that does not overlap any of first defect 81, second defect 82, third defect 83, and fourth defect 84 is determined as a non-defective product. As described above, the position coordinates of defect 80 and the position coordinates of device active region 90 are associated with each other, and the pass/fail judgement of device active region 90 is performed.

Figure 20:
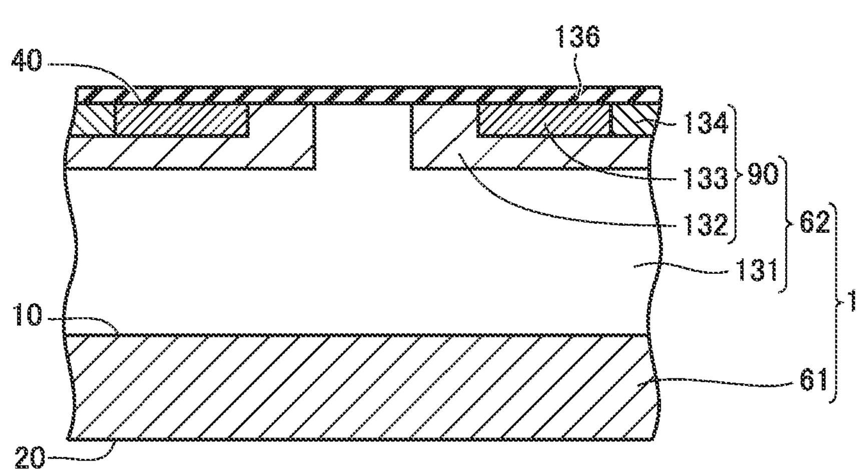
FIG. 20 is a schematic cross-sectional view showing a step of forming a gate insulating film.

FIG. 20 is a schematic cross-sectional view showing a step of forming a gate insulating film. As shown in FIG. 20, silicon carbide substrate 1 is heated in an atmosphere containing oxygen to form a gate insulating film 136 on silicon carbide epitaxial film 62. Gate insulating film 136 is made of, for example, silicon dioxide ($SiO_2$) or the like. The temperature of the thermal oxidation treatment is, for example, about 1300° C. The duration of the thermal oxidation treatment is, for example, about 30 minutes.

After gate insulating film 136 is formed, heat treatment may be further performed in a nitrogen atmosphere. For example, the heat treatment may be performed at about 1100° C. for about 1 hour in an atmosphere of nitrogen monoxide (NO), nitrous oxide ($N_2O$), or the like. Thereafter, a heat treatment may be performed in an argon atmosphere. For example, the heat treatment may be performed in an argon atmosphere at about 1100° C. or more and 1500° C. or less for about 1 hour.

Next, a first electrode 141 is formed on gate insulating film 136. First electrode 141 functions as a gate electrode. First electrode 141 is formed by, for example, a CVD method. First electrode 141 is made of, for example, polysilicon containing impurities and having conductivity. First electrode 141 is formed at a position facing source region 133 and body region 132.

Next, an interlayer insulating film 137 is formed. Interlayer insulating film 137 is formed to cover first electrode 141. Interlayer insulating film 137 is formed by, for example, a CVD method. Interlayer insulating film 137 is made of silicon dioxide or the like, for example. Interlayer insulating film 137 is formed to contact with first electrode 141 and gate insulating film 136. Next, a part of gate insulating film 136 and a part of interlayer insulating film 137 are removed by etching. Thus, source region 133 and contact region 134 are exposed from gate insulating film 136.

Next, a second electrode 142 is formed. Second electrode 142 functions as a source electrode. Second electrode 142 is made of, for example, titanium, aluminum, silicon, or the like. After second electrode 142 is formed, second electrode 142 and silicon carbide substrate 1 are heated at a temperature of, for example, about 900° C. or more and 1100° C. or less. Accordingly, second electrode 142 and silicon carbide substrate 1 are in ohmic contact with each other. Next, a wiring layer 138 is formed so as to be in contact with second electrode 142. Wiring layer 138 is made of, for example, a material containing aluminum.

Next, a third electrode 143 is formed. Third electrode 143 functions as a drain electrode. Third electrode 143 is made of, for example, an alloy containing nickel and silicon (for example, NiSi).

Next, a dicing step is performed. For example, silicon carbide substrate 1 is diced along dicing region 91, thereby dividing silicon carbide substrate 1 into a plurality of semiconductor chips. As described above, silicon carbide semiconductor device 300 is manufactured.

Figure 21:
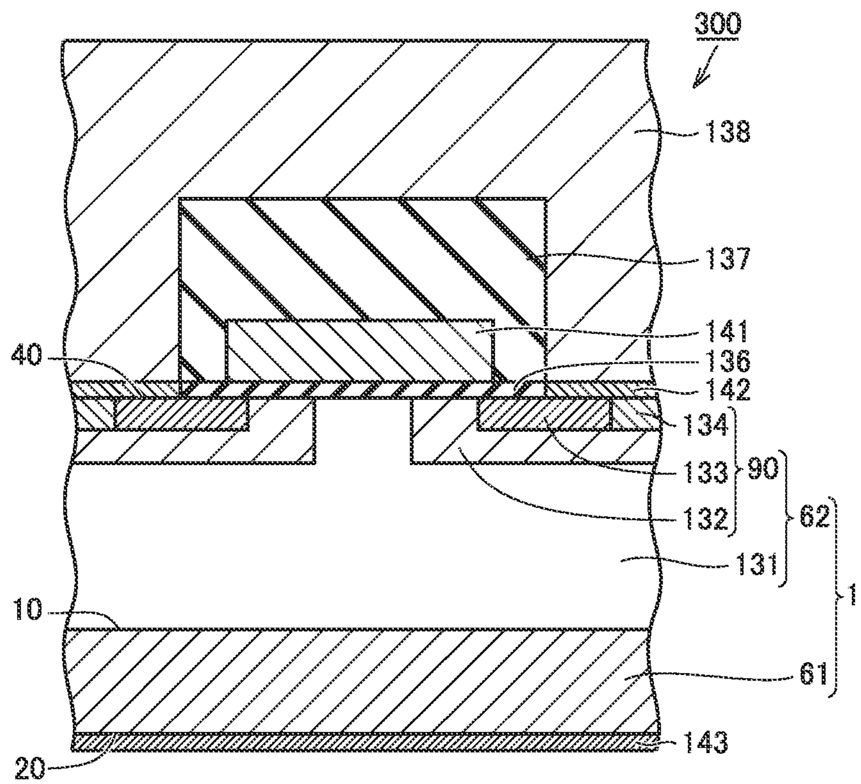
FIG. 21 is a schematic cross-sectional view showing a configuration of a silicon carbide semiconductor device.

FIG. 21 is a schematic cross-sectional view showing a configuration of silicon carbide semiconductor device 300. As shown in FIG. 21, silicon carbide semiconductor device 300 is, for example, a MOSFET (Metal Oxide Semiconductor Field Effect Transistor). Silicon carbide semiconductor device 300 includes silicon carbide substrate 1, first electrode 141, second electrode 142, third electrode 143, gate insulating film 136, interlayer insulating film 137, and wiring layer 138. Silicon carbide substrate 1 includes a silicon carbide single-crystal substrate 61 and silicon carbide epitaxial film 62. Silicon carbide epitaxial film 62 includes drift region 131, source region 133, body region 132, and contact region 134.

Although the method of manufacturing silicon carbide semiconductor device 300 according to the present disclosure has been described above using a MOSFET as an example, the method of manufacturing according to the present disclosure is not limited thereto. The manufacturing method according to the present disclosure is applicable to silicon carbide semiconductor device 300 such as an IGBT (Insulated Gate Bipolar Transistor), an SBD (Schottky Barrier Diode), a thyristor, a GTO (Gate Turn Off thyristor), or a PiN diode.

Seventh Embodiment

Next, a method of manufacturing silicon carbide semiconductor device 300 according to the seventh embodiment will be described. The method of manufacturing silicon carbide semiconductor device 300 according to the seventh embodiment is different from the method of manufacturing silicon carbide semiconductor device 300 according to the sixth embodiment mainly in that it includes a step of adjusting a formation position of device active region 90 based on the position coordinates of defect 80, and the other steps are the same as those of the method of manufacturing silicon carbide semiconductor device 300 according to the sixth embodiment. Hereinafter, steps different from the method of manufacturing silicon carbide semiconductor device 300 according to the sixth embodiment will be mainly described.

Figure 22:
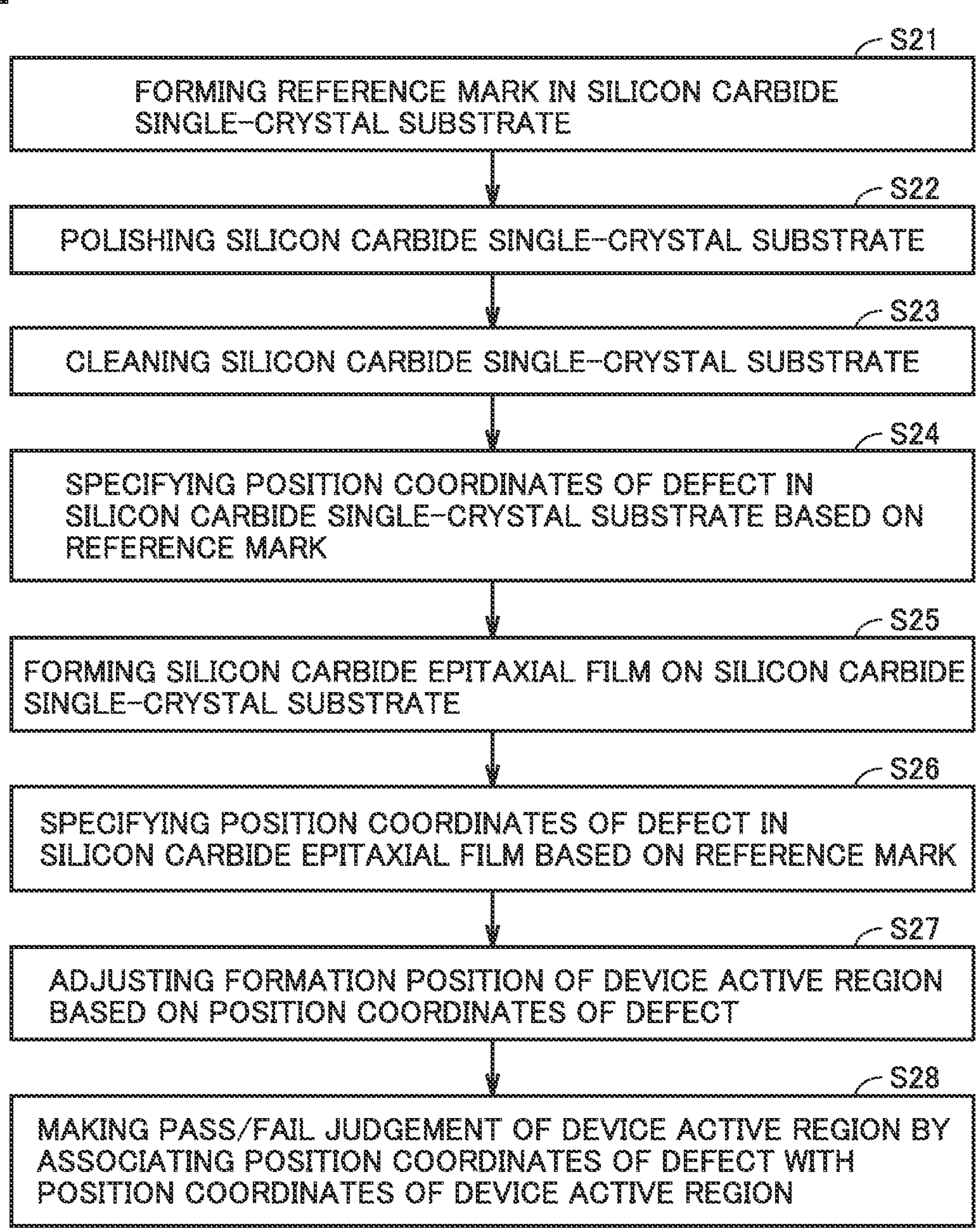
FIG. 22 is a flow diagram schematically illustrating a method of manufacturing a silicon carbide semiconductor device according to a seventh embodiment.

FIG. 22 is a flow diagram schematically illustrating a method of fabricating silicon carbide semiconductor device 300 according to a seventh embodiment. As shown in FIG. 22, the method of manufacturing silicon carbide semiconductor device 300 according to the seventh embodiment mainly includes the steps of forming a reference mark on a silicon carbide single-crystal substrate (S21), polishing the silicon carbide single-crystal substrate (S22), cleaning the silicon carbide single-crystal substrate (S23), specifying the position coordinates of a defect in the silicon carbide single-crystal substrate based on the reference mark (S24), forming a silicon carbide epitaxial film on the silicon carbide single-crystal substrate (S25), specifying the position coordinates of a defect in the silicon carbide epitaxial film based on the reference mark (S26), adjusting a formation position of a device active region based on the position coordinates of the defect (S27), and making a pass/fail judgement of the device active region by associating the position coordinates of the defect with the position coordinates of the device active region (S28).

First, a step (S21) of forming a reference mark is performed. The step (S21) of forming a reference mark in the silicon carbide single-crystal substrate according to the seventh embodiment is the same as the step (SI 1) of forming a reference mark in the silicon carbide single-crystal substrate according to the sixth embodiment.

Next, a step (S22) of polishing the silicon carbide single-crystal substrate is performed. The step (S22) of polishing the silicon carbide single-crystal substrate according to the seventh embodiment is the same as the step (S12) of polishing the silicon carbide single-crystal substrate according to the sixth embodiment.

Next, a step (S23) of cleaning the silicon carbide single-crystal substrate is performed. The step (S23) of cleaning the silicon carbide single-crystal substrate according to the seventh embodiment is the same as the step (S13) of cleaning the silicon carbide single-crystal substrate according to the sixth embodiment.

Next, a step (S24) of specifying the position coordinates of a defect in the silicon carbide single-crystal substrate based on the reference mark is performed. The step (S24) of specifying the position coordinates of the defect in the silicon carbide single-crystal substrate based on the reference mark according to the seventh embodiment is the same as the step (S14) of specifying the position coordinates of the defect in the silicon carbide single-crystal substrate based on the reference mark according to the sixth embodiment.

Next, a step (S25) of forming a silicon carbide epitaxial film on the silicon carbide single-crystal substrate is performed. The step (S25) of forming the silicon carbide epitaxial film on the silicon carbide single-crystal substrate according to the seventh embodiment is the same as the step (S15) of forming a silicon carbide epitaxial film on the silicon carbide single-crystal substrate according to the sixth embodiment.

Next, a step (S26) of specifying the position coordinates of a defect of the silicon carbide epitaxial film based on the reference mark is performed. The step (S26) of specifying the position coordinates of a defect of the silicon carbide epitaxial film based on the reference mark according to the seventh embodiment is the same as the step (S16) of specifying the position coordinates of a defect of the silicon carbide epitaxial film based on the reference mark according to the sixth embodiment.

Figure 23:
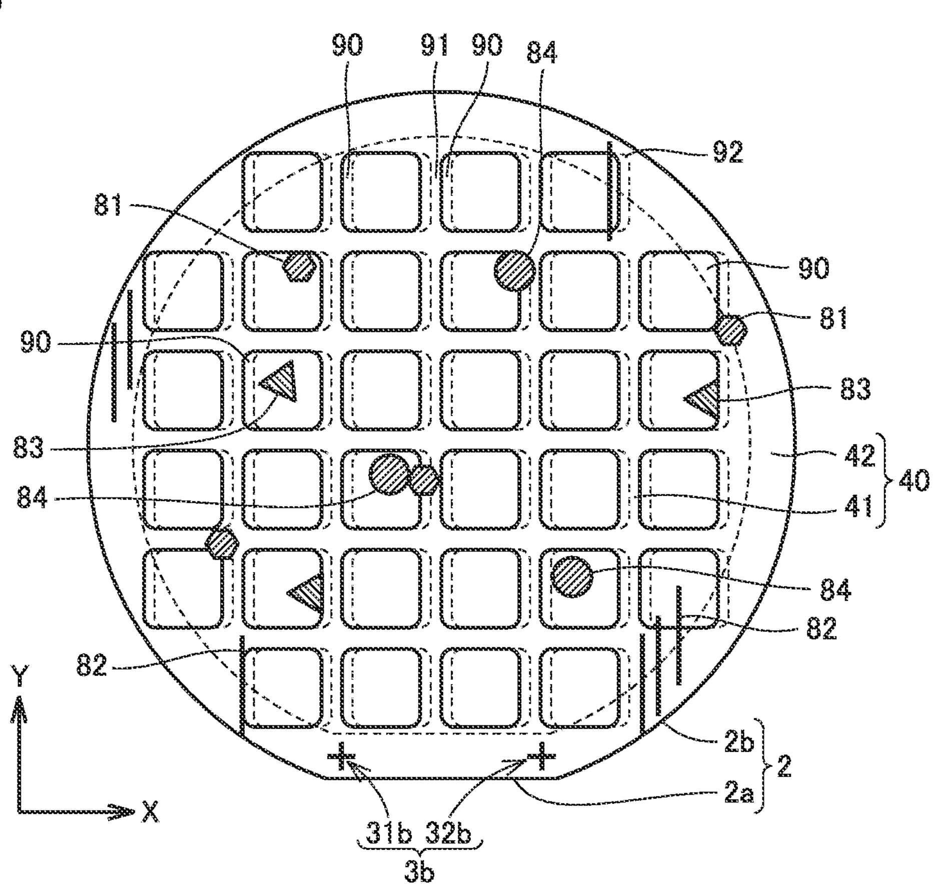
FIG. 23 is a schematic plan view showing a step of adjusting the formation position of the device active region based on the position coordinates of the defect.

Next, a step (S27) of adjusting a formation position of a device active region based on the position coordinates of the defect is performed. FIG. 23 is a schematic plan view showing a step of adjusting a formation position of device active region 90 based on the position coordinates of defect 80. In FIG. 23, a substantially square region 92 indicated by a dashed line is a region where device active region 90 is to be formed. In the step (S24) of specifying the position coordinates of the defects in the silicon carbide single-crystal substrate based on the reference marks, the two dimensional position coordinates of each of first defect 81 and second defect 82 in silicon carbide single-crystal substrate 61 have already been specified. In the step (S26) of specifying the position coordinates of the defect of the silicon carbide epitaxial film based on reference mark 3, the two dimensional position coordinates of each of third defect 83 and fourth defect 84 in silicon carbide epitaxial film 62 have already been specified.

In the step (S27) of adjusting a formation position of the device active region based on the position coordinates of the defect, the formation position of device active region 90 is adjusted so that each of first defect 81, second defect 82, third defect 83, and fourth defect 84 does not overlap with device active region 90 as possible. From another point of view, the formation position of device active region 90 is adjusted so that the number of device active regions 90 overlapping each of first defect 81, second defect 82, third defect 83, and fourth defect 84 is minimized. For example, the formation position of device active region 90 is adjusted so that each of first defect 81, second defect 82, third defect 83, and fourth defect 84 is formed in dicing region 91 between two adjacent device active regions 90. As described above, the formation position of device active region 90 is adjusted based on the position coordinates of defect 80. In other words, the formation position of device active region 90 is optimally designed.

Next, a step (S28) of making a pass/fail judgement of the device active region by associating the position coordinates of the defect with the position coordinates of the device active region is performed. The step (S28) of making a pass/fail judgement of the device active region by associating the position coordinates of the defect with the position coordinates of the device active region according to the seventh embodiment is the same as the step (S19) of making a pass/fail judgement of the device active region by associating the position coordinates of the defect with the position coordinates of the device active region according to the sixth embodiment.

Next, gate insulating film 136 is formed using the same method as the method of manufacturing silicon carbide semiconductor device 300 according to the sixth embodiment (see FIG. 20). Next, first electrode 141, second electrode 142, interlayer insulating film 137, wiring layer 138, and third electrode 143 are formed using the same method as the method of manufacturing silicon carbide semiconductor device 300 according to the sixth embodiment. Next, silicon carbide substrate 1 is cut along dicing region 91. Thus, silicon carbide semiconductor device 300 is manufactured (see FIG. 21).

Eighth Embodiment

Next, a method of manufacturing silicon carbide semiconductor device 300 according to the eighth embodiment will be described. The method of manufacturing silicon carbide semiconductor device 300 according to the eighth embodiment differs from the method of manufacturing silicon carbide semiconductor device 300 according to the sixth embodiment mainly in that it does not include the step of forming reference mark 3 on the silicon carbide single-crystal substrate 61, and the other steps are the same as those of the method of manufacturing silicon carbide semiconductor device 300 according to the sixth embodiment. Hereinafter, steps different from the method of manufacturing silicon carbide semiconductor device 300 according to the sixth embodiment will be mainly described.

Figure 24:
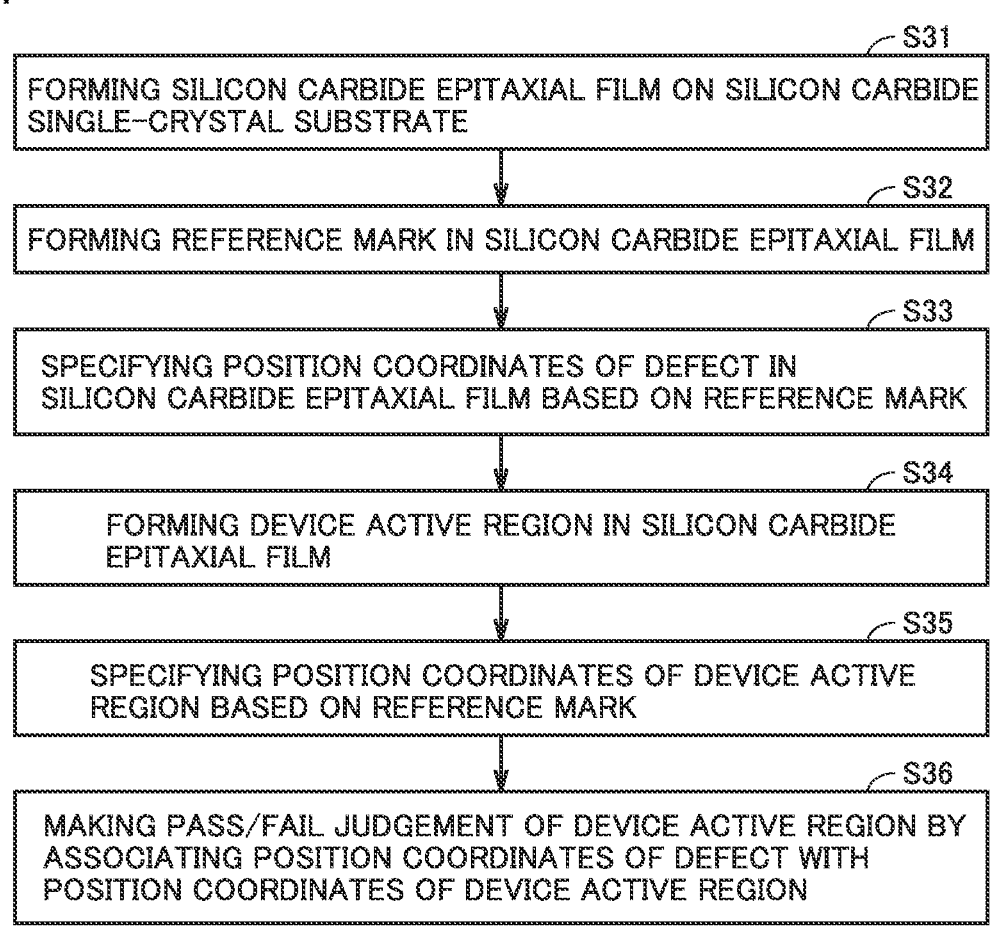
FIG. 24 is a flow diagram schematically illustrating a method of manufacturing a silicon carbide semiconductor device according to an eighth embodiment.

FIG. 24 is a flow diagram schematically illustrating a method of manufacturing silicon carbide semiconductor device 300 according to an eighth embodiment. As shown in FIG. 24, the method of manufacturing silicon carbide semiconductor device 300 according to the eighth embodiment includes the steps of forming a silicon carbide epitaxial film on a silicon carbide single-crystal substrate (S31), forming a reference mark in the silicon carbide epitaxial film (S32), specifying the position coordinates of a defect in the silicon carbide epitaxial film based on the reference mark (S33), forming a device active region in the silicon carbide epitaxial film (S34), specifying the position coordinates of the device active region based on the reference mark (S35), and making a pass/fail judgement of the device active region by associating the position coordinates of the defect with the position coordinates of the device active region (S36).

Figure 25:
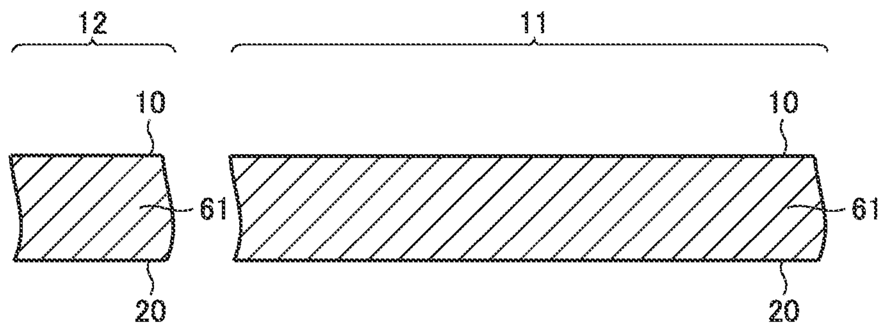
FIG. 25 is a schematic cross-sectional view showing a step of preparing a silicon carbide single-crystal substrate.

FIG. 25 is a schematic cross-sectional view showing a step of preparing silicon carbide single-crystal substrate 61. As shown in FIG. 25, silicon carbide single-crystal substrate 61 has central region 11 and outer peripheral region 12. Reference mark 3 is not formed in any of central region 11 and outer peripheral region 12.

Figure 26:
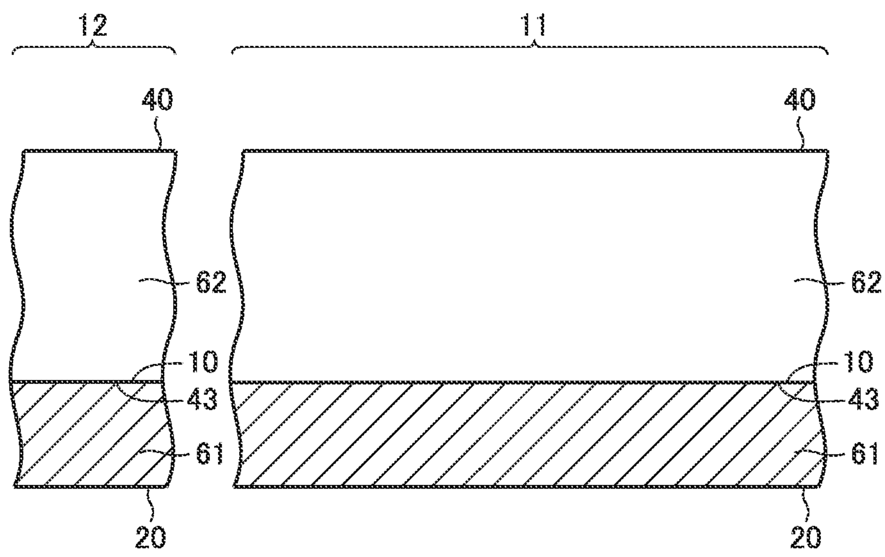
FIG. 26 is a schematic cross-sectional view showing a step of forming a silicon carbide epitaxial film on a silicon carbide single-crystal substrate.

FIG. 26 is a schematic cross-sectional view showing a step of forming silicon carbide epitaxial film 62 on a silicon carbide single-crystal substrate 61. As shown in FIG. 26, silicon carbide epitaxial film 62 is formed on a silicon carbide single-crystal substrate 61 by epitaxial growth. Silicon carbide epitaxial film 62 has third main surface 43 and fourth main surface 40. Third main surface 43 is in contact with silicon carbide single-crystal substrate 61. Fourth main surface 40 is opposite to third main surface 43.

Figure 27:
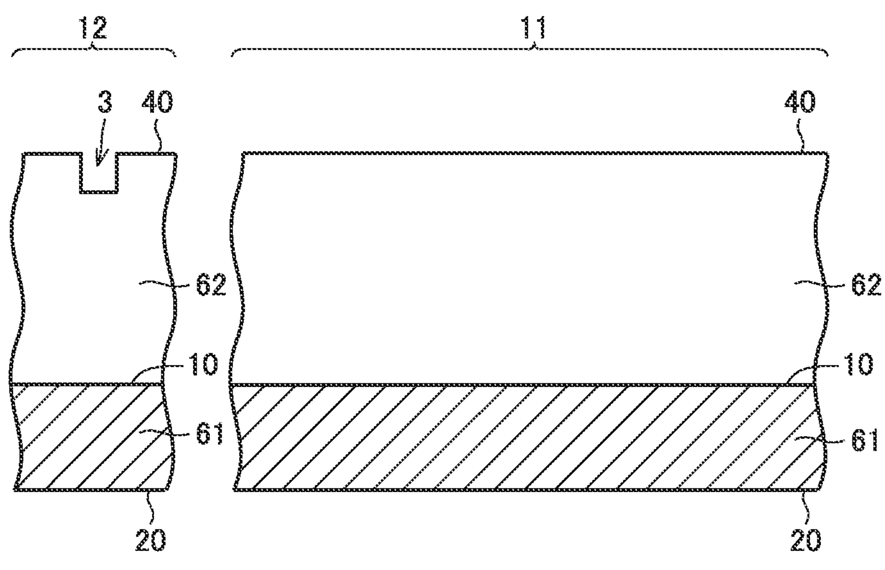
FIG. 27 is a schematic cross-sectional view showing a step of forming a reference mark in a silicon carbide epitaxial film.

FIG. 27 is a schematic cross-sectional view showing a step of forming reference mark 3 in silicon carbide epitaxial film 62. As shown in FIG. 27, reference mark 3 is formed in outer peripheral region 12 of fourth main surface 40 of silicon carbide epitaxial film 62.

After reference mark 3 is formed, at least one of polishing or cleaning is performed on the reference mark formation surface of silicon carbide epitaxial film 62 provided on silicon carbide single-crystal substrate 61. The reference mark formation surface corresponds to fourth main surface 40.

Next, a step (S33) of specifying position coordinates of a defect of the silicon carbide epitaxial film based on the reference mark is performed. The step (S33) of specifying position coordinates of a defect of the silicon carbide epitaxial film based on the reference mark according to the eighth embodiment is the same as the step (S16) of specifying position coordinates of a defect of the silicon carbide epitaxial film based on the reference mark according to the sixth embodiment.

FIG. 28 is a schematic cross-sectional view showing a step of forming device active region 90 in silicon carbide epitaxial film 62. As shown in FIG. 28, device active region 90 is formed in silicon carbide epitaxial film 62. Element active region 90 includes, for example, body region 132, source region 133, and contact region 134. As described above, each of reference mark 3 and device active region 90 is provided in silicon carbide epitaxial film 62.

Next, a step (S35) of specifying position coordinates of the device active region based on the reference mark is performed. The step (S35) of specifying position coordinates of the device active region based on the reference mark according to the eighth embodiment is the same as the step (S18) of specifying position coordinates of the device active region based on the reference mark according to the sixth embodiment. Next, a step (S36) of making a pass/fail judgement of device active region 90 by associating the position coordinates of defect 80 with the position coordinates of device active region 90 is performed. The step (S36) of making a pass/fail judgement of the device active region by associating the position coordinates of the defect with the position coordinates of the device active region according to the eighth embodiment is the same as the step (S19) of making a pass/fail judgement of the device active region by associating the position coordinates of the defect with the position coordinates of the device active region according to the sixth embodiment.

Next, gate insulating film 136 is formed using the same method as the method of manufacturing silicon carbide semiconductor device 300 according to the sixth embodiment (see FIG. 20). Next, first electrode 141, second electrode 142, interlayer insulating film 137, wiring layer 138, and third electrode 143 are formed using the same method as the method of manufacturing silicon carbide semiconductor device 300 according to the sixth embodiment. Next, silicon carbide substrate 1 is cut along dicing region 91. Thus, silicon carbide semiconductor device 300 is manufactured (see FIG. 21).

Ninth Embodiment

Next, a method of manufacturing silicon carbide semiconductor device 300 according to the ninth embodiment will be described. The method of manufacturing silicon carbide semiconductor device 300 according to the ninth embodiment is different from the method of manufacturing silicon carbide semiconductor device 300 according to the eighth embodiment mainly in that reference marks 3 are formed in both a first silicon carbide epitaxial film 71 and a second silicon carbide epitaxial film 72, and the other steps are the same as those of the method of manufacturing silicon carbide semiconductor device 300 according to the eighth embodiment. Hereinafter, steps different from the method of manufacturing silicon carbide semiconductor device 300 according to the eighth embodiment will be mainly described.

FIG. 29 is a flow diagram schematically illustrating a method of manufacturing silicon carbide semiconductor device 300 in accordance with a ninth embodiment. As shown in FIG. 29, the method of manufacturing silicon carbide semiconductor device 300 according to the ninth embodiment includes the steps of forming a first silicon carbide epitaxial film on a silicon carbide single-crystal substrate (S41), forming a reference mark in the first silicon carbide epitaxial film (S42), specifying position coordinates of a defect in the first silicon carbide epitaxial film based on the reference mark (S43), forming a second silicon carbide epitaxial film on the first silicon carbide epitaxial film (S44), specifying position coordinates of a defect in the second silicon carbide epitaxial film based on the reference mark (S45), forming a device active region in the second silicon carbide epitaxial film (S46), specifying position coordinates of the device active region based on the reference mark (S47), and making a pass/fail judgement of device active region 90 by associating the position coordinates of the defect with the position coordinates of the device active region (S48).

Figure 30:
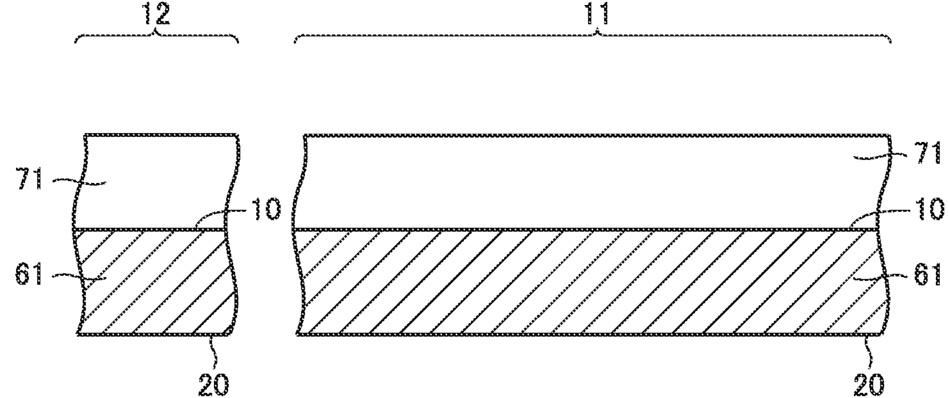
FIG. 30 is a schematic cross-sectional view showing a step of forming a first silicon carbide epitaxial film on a silicon carbide single-crystal substrate.

FIG. 30 is a schematic cross-sectional view showing a step of forming first silicon carbide epitaxial film 71 on a silicon carbide single-crystal substrate 61. As shown in FIG. 30, first silicon carbide epitaxial film 71 is formed on a silicon carbide single-crystal substrate 61 by epitaxial growth.

Figure 31:
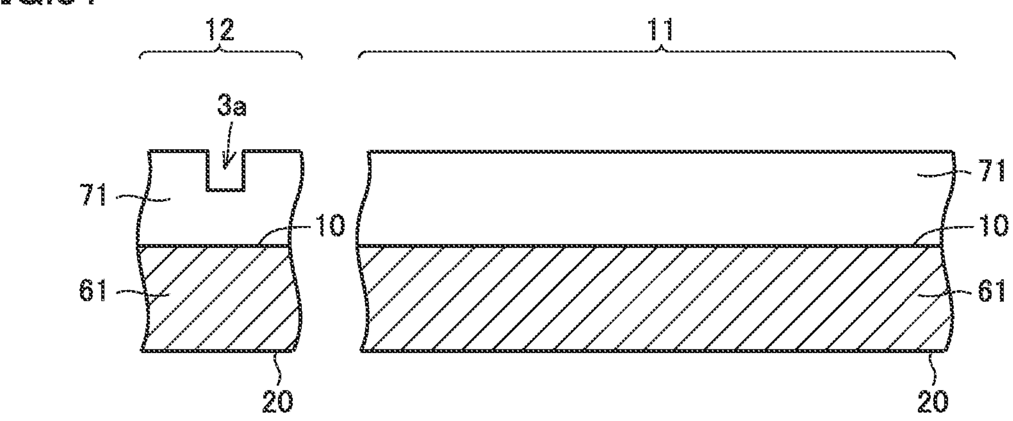
FIG. 31 is a schematic cross-sectional view showing a step of forming a reference mark in the first silicon carbide epitaxial film.

FIG. 31 is a schematic cross-sectional view showing a step of forming reference mark 3 in first silicon carbide epitaxial film 71. As shown in FIG. 31, reference mark 3 (first mark 3*a*) is formed in outer peripheral region 12 of first silicon carbide epitaxial film 71.

After forming reference mark 3 (first mark 3*a*), at least one of polishing or cleaning is performed on the reference mark formation surface of first silicon carbide epitaxial film 71 provided on silicon carbide single-crystal substrate 61. The reference mark formation surface may correspond to a top surface of first silicon carbide epitaxial film 71.

Next, a step (S43) of specifying position coordinates of a defect of the first silicon carbide epitaxial film based on the reference mark is performed. The step (S43) of specifying position coordinates of a defect of the first silicon carbide epitaxial film based on the reference mark according to the ninth embodiment is the same as the step (S33) of specifying position coordinates of a defect of the silicon carbide epitaxial film based on the reference mark according to the eighth embodiment.

Figure 32:
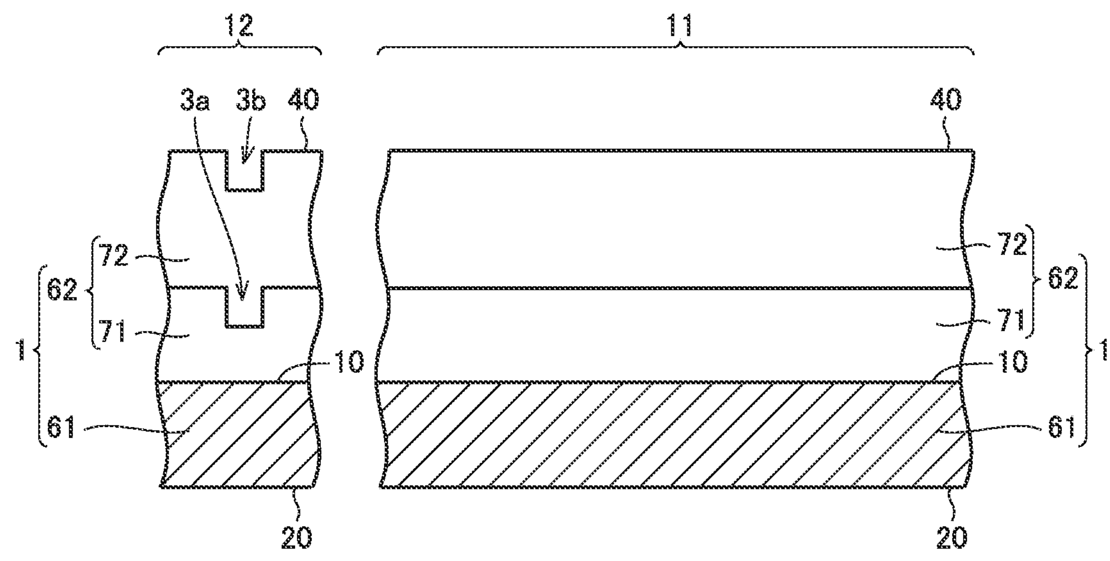
FIG. 32 is a schematic cross-sectional view showing a step of forming a second silicon carbide epitaxial film on a first silicon carbide epitaxial film.

FIG. 32 is a schematic cross-sectional view showing a step of forming second silicon carbide epitaxial film 72 on first silicon carbide epitaxial film 71. As shown in FIG. 32, second silicon carbide epitaxial film 72 is formed on first silicon carbide epitaxial film 71 by epitaxial growth. Reference mark 3 (second mark 3*b*) may be formed in outer peripheral region 12 of second silicon carbide epitaxial film 72. Second mark 3*b* is located just above first mark 3*a*.

Only a partial region of second silicon carbide epitaxial film 72 provided on reference mark 3 (first mark 3*a*) may be removed by etching or the like until first silicon carbide epitaxial film 71 is exposed. Since reference mark 3 (first mark 3*a*) provided on first silicon carbide epitaxial film 71 is exposed by etching or the like, reference mark 3 (first mark 3*a*) can be more accurately determined. The etching of second silicon carbide epitaxial film 72 may be performed until first silicon carbide epitaxial film 71 is exposed, or may be stopped just before first silicon carbide epitaxial film 71 is exposed. When the etching is stopped just before first silicon carbide epitaxial film 71 is exposed, second silicon carbide epitaxial film 72 may remain on reference mark 3 (first mark 3*a*).

Next, a step (S45) of specifying position coordinates of a defect of the second silicon carbide epitaxial film based on the reference mark is performed. The step (S45) of specifying position coordinates of a defect of the second silicon carbide epitaxial film based on the reference mark according to the ninth embodiment is the same as the step (S33) of specifying position coordinates of a defect of the silicon carbide epitaxial film based on the reference mark according to the eighth embodiment.

Figure 33:
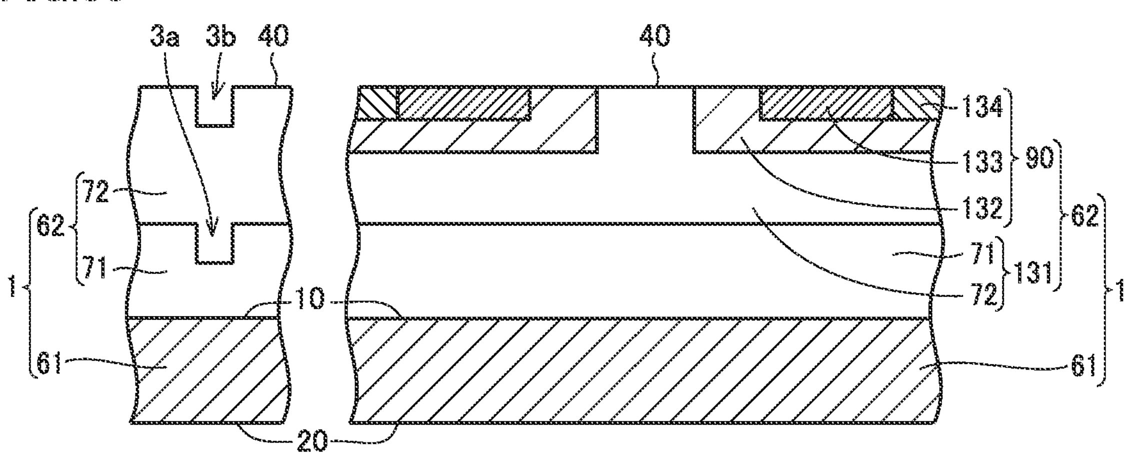
FIG. 33 is a schematic cross-sectional view showing a step of forming a device active region in the second silicon carbide epitaxial film.

Next, a step (S46) of forming a device active region in the second silicon carbide epitaxial film is performed. FIG. 33 is a schematic cross-sectional view showing a step of forming a device active region in a second silicon carbide epitaxial film. The step (S46) of forming a device active region in the second silicon carbide epitaxial film according to the ninth embodiment is the same as the step (S34) of forming a device active region in the silicon carbide epitaxial film according to the eighth embodiment. As shown in FIG. 33, device active region 90 is formed in second silicon carbide epitaxial film 72. Device active region 90 may be formed in both first silicon carbide epitaxial film 71 and second silicon carbide epitaxial film 72.

Next, a step (S47) of specifying position coordinates of the device active region based on the reference mark is performed. The step (S47) of specifying position coordinates of the device active region based on the reference mark according to the ninth embodiment is the same as the step (S35) of specifying position coordinates of the device active region based on the reference mark according to the eighth embodiment.

Next, a step (S48) of making a pass/fail judgement of the device active region by associating the position coordinates of the defect with the position coordinates of the device active region is performed. The step (S48) of making a pass/fail judgement of the device active region by associating the position coordinates of the defect with the position coordinates of the device active region according to the ninth embodiment is the same as the step (S36) of making a pass/fail judgement of the device active region by associating the position coordinates of the defect with the position coordinates of the device active region according to the eighth embodiment.

Next, gate insulating film 136 is formed using the same method as the method of manufacturing silicon carbide semiconductor device 300 according to the sixth embodiment (see FIG. 20). Next, first electrode 141, second electrode 142, interlayer insulating film 137, wiring layer 138, and third electrode 143 are formed using the same method as the method of manufacturing silicon carbide semiconductor device 300 according to the sixth embodiment. Next, silicon carbide substrate 1 is cut along dicing region 91. Thus, silicon carbide semiconductor device 300 is manufactured (see FIG. 21).

Although reference mark 3 is formed in outer peripheral region 12 in the method of manufacturing silicon carbide semiconductor device 300 according to the sixth to ninth embodiments, reference mark 3 is not limited to be formed in outer peripheral region 12. Specifically, reference mark 3 may be provided only in central region 11, or may be provided in both outer peripheral region 12 and central region 11. When reference mark 3 is provided in central region 11, reference mark 3 is provided, for example, in dicing region 91. Reference mark 3 may be formed on the surface (first main surface 10) of silicon carbide single-crystal substrate 61 or may be formed on the backside surface (second main surface 20).

Next, advantageous effects of silicon carbide single-crystal substrate 61, silicon carbide substrate 1, and the method of manufacturing silicon carbide semiconductor device 300 according to the above-described embodiments will be described.

According to the method of manufacturing silicon carbide semiconductor device 300 according to one aspect of the above embodiment, the position coordinates of defect 80 in silicon carbide substrate 1 are specified based on reference mark 3. Device active region 90 is formed in silicon carbide substrate 1. Based on reference mark 3, the position coordinates of device active region 90 are specified. The position coordinates of defect 80 and the position coordinates of device active region 90 are associated with each other to make a pass/fail judgement of device active region 90. By associating the position coordinates of defect 80 with the position coordinates of device active region 90 using the common coordinates using reference mark 3, it is possible to accurately determine a defective device caused by defect 80. Therefore, it is possible to accurately determine whether device active region 90 is pass or fail.

In addition, before silicon carbide semiconductor device 300 is completed, it is possible to accurately estimate a failure rate of the device caused by defect 80. It is possible to optimally design a device structure or a device arrangement based on the failure rate of the device.

According to the method of manufacturing silicon carbide semiconductor device 300 according to one aspect of the above embodiment, in the step of forming device active region 90 on silicon carbide substrate 1, the formation position of device active region 90 may be adjusted based on the position coordinates of defect 80. Thus, device active region 90 can be formed so as to avoid defect 80. Therefore, the yield of the device can be improved.

According to the method of manufacturing silicon carbide semiconductor device 300 in accordance with one aspect of the above embodiment, reference mark 3 may be provided in silicon carbide single-crystal substrate 61. Element active region 90 may be provided in silicon carbide epitaxial film 62.

When reference mark 3 is provided in silicon carbide single-crystal substrate 61, it is desirable that, after the formation of the reference mark, the reference mark formation surface is polished and then the reference mark surface is cleaned in order to remove irregularities, distortion, foreign matter such as dust, and dirt in the vicinity of the reference mark due to the processing. The polishing may be performed only on the reference mark formation surface, or may be performed on both the reference mark formation surface and the surface opposite to the reference mark formation surface.

Only a partial region of silicon carbide epitaxial film 62 provided above reference mark 3 may be removed by etching or the like until the silicon carbide single-crystal substrate 61 is exposed. When reference mark 3 provided on silicon carbide single-crystal substrate 61 is exposed by etching or the like, reference mark 3 can be more accurately determined. The etching of silicon carbide epitaxial film 62 may be performed until the silicon carbide single-crystal substrate 61 is exposed, or may be stopped just before the silicon carbide single-crystal substrate 61 is exposed. When the etching is stopped just before the silicon carbide single-crystal substrate 61 is exposed, silicon carbide epitaxial film 62 may remain on reference mark 3.

According to the method of manufacturing silicon carbide semiconductor device 300 according to one aspect of the above embodiment, each of reference mark 3 and device active region 90 may be provided in silicon carbide epitaxial film 62. When reference mark 3 is formed in silicon carbide epitaxial film 62, the reference mark formation surface is polished or cleaned after reference mark 3 is formed.

According to the method of manufacturing silicon carbide semiconductor device 300 according to one aspect of the above embodiment, reference mark 3 may be formed by laser machining. If reference mark 3 is an indentation, dust may be generated when reference mark 3 is formed. Since reference mark 3 is formed by laser machining, generation of dust can be suppressed. Therefore, the yield of the device can be further improved. If reference mark 3 is an indentation, it is difficult to form reference mark 3 deeply. Therefore, if polishing is performed on the reference mark formation surface in order to remove unevenness and distortion in the vicinity of reference mark 3 generated when reference mark 3 is processed, reference mark 3 may disappear. In this case, it is difficult to discriminate reference mark 3. Since reference mark 3 is formed by laser machining, reference mark 3 can be deeply formed. Therefore, polishing can be performed on the reference mark formation surface in order to remove unevenness and distortion in the vicinity of reference mark 3 generated when reference mark 3 is processed. Further, at the time of alignment, reference mark 3 can be accurately discriminated. Further, if reference mark 3 is an indentation, a crack may be generated in the substrate on which reference mark 3 is formed. Since reference mark 3 is formed by laser machining, the occurrence of cracks in the substrate can be suppressed.

In the case where reference mark 3 is provided in silicon carbide single-crystal substrate 61, after the formation of the reference mark, it is desirable to polish the reference mark formation surface and then clean the reference mark formation surface in order to remove irregularities, distortion, foreign matter such as dust and dirt in the vicinity of the reference mark due to processing. The polishing may be performed only on the reference mark formation surface, or may be performed on both the reference mark formation surface and the surface opposite to the reference mark formation surface. When reference mark 3 is formed in silicon carbide epitaxial film 62, the reference mark formation surface is polished or cleaned after reference mark 3 is formed.

In the method of manufacturing silicon carbide semiconductor device 300 according to one aspect of the above embodiment, reference mark 3 may be formed by etching. If reference mark 3 is an indentation, dust may be generated when reference mark 3 is formed. Since reference mark 3 is formed by etching, generation of dust can be suppressed. Therefore, the yield of the device can be further improved. If reference mark 3 is an indentation, it is difficult to form reference mark 3 deeply. Therefore, if polishing is performed on the reference mark formation surface in order to remove unevenness and distortion in the vicinity of reference mark 3 generated when reference mark 3 is processed, reference mark 3 may disappear. In this case, it is difficult to discriminate reference mark 3. Since reference mark 3 is formed by etching, reference mark 3 can be formed deeply. Therefore, polishing can be performed on the reference mark formation surface in order to remove unevenness and distortion in the vicinity of reference mark 3 generated when reference mark 3 is processed. Further, at the time of alignment, reference mark 3 can be accurately determined. Further, if reference mark 3 is an indentation, a crack may be generated in the substrate on which reference mark 3 is formed. Since reference mark 3 is formed by etching, the occurrence of cracks in the substrate can be suppressed.

In the case where reference mark 3 is provided in silicon carbide single-crystal substrate 61, after the formation of the reference mark, it is desirable to polish the reference mark formation surface and then clean the reference mark formation surface in order to remove irregularities, distortion, foreign matter such as dust and dirt in the vicinity of the reference mark due to processing. The polishing may be performed only on the reference mark formation surface, or may be performed on both the reference mark formation surface and the surface opposite to the reference mark formation surface. When reference mark 3 is formed in silicon carbide epitaxial film 62, the reference mark formation surface is polished or cleaned after reference mark 3 is formed.

Silicon carbide substrate 1 and the silicon carbide single-crystal substrate 61 according to one aspect of the above embodiment include outer peripheral edge 2 and main surface 10. Main face 10 is surrounded by outer peripheral edge 2. Main face 10 includes outer peripheral region 12 which is a region within 5 mm from outer peripheral edge 2, and central region 11 surrounded by outer peripheral region 12. Outer peripheral region 12 is provided with a plurality of reference marks 3 serving as references for two dimensional position coordinates. Thus, as compared with the case where reference mark 3 is provided in central region 11, it is possible to secure a large area of the region in which the element is formed.

In silicon carbide substrate 1 and the silicon carbide single-crystal substrate 61 according to one aspect of the embodiment, when viewed in a direction perpendicular to main surface 10, a distance between the plurality of reference marks 3 may be 30 mm or more. Thus, the position coordinates of defect 80 can be specified with high accuracy.

In silicon carbide substrate 1 and the silicon carbide single-crystal substrate 61 according to one aspect of the above embodiment, when viewed in a direction perpendicular to main surface 10, the smallest imaginary circle surrounding each of the plurality of reference marks 3 may have a diameter of more than 10 μm and less than 3 mm. This makes it possible to accurately determine reference mark 3 during alignment.

In silicon carbide substrate 1 and the silicon carbide single-crystal substrate 61 according to one aspect of the above embodiment, the depth of each of the plurality of reference marks 3 in the direction perpendicular to main surface 10 is preferably about 1/10 to 10 times the thickness of silicon carbide epitaxial film 62. The depth of each of the plurality of reference marks 3 may be, for example, more than 0.5 μm and less than 100 μm. In the case where reference mark 3 is provided in silicon carbide single-crystal substrate 61, by forming a reference mark having the above-described depth, reference mark 3 can be accurately determined during alignment even if the shape of reference mark 3 which is carried over to silicon carbide epitaxial film 62 and formed is somewhat deformed depending on the growth conditions (e.g., growth temperature and C/Si ratio) of silicon carbide epitaxial film 62.

In silicon carbide substrate 1 and silicon carbide single-crystal substrate 61 according to one aspect of the above embodiment, each of reference marks 3 may have a cross shape when viewed in a direction perpendicular to main surface 10. This makes it possible to accurately determine reference mark 3 during alignment.

The embodiments and the examples disclosed herein should be considered to be illustrative in all respects and not restrictive. The scope of the present invention is defined by the claims, instead of the descriptions stated above, and it is intended that meanings equivalent to the claims and all modifications within the scope are included.

REFERENCE SIGNS LIST

1 silicon carbide substrate, 2 outer peripheral edge, 2*a* orientation flat, 2*b* arc-shaped portion, 3 reference mark, 3*a* first mark, 3*b* second mark, 10 first main surface, 11,41 central region, 12,42 outer peripheral region, 20 second main surface, 30 recess, 31, 31*a*, 31*b* first reference mark, 32, 32*a*, 32*b* second reference mark, 33 third reference mark, 34 fourth reference mark, 40 fourth main surface, 43 third main surface, 52 side surface, 53 bottom surface, 54 trench, 61 single-crystal substrate, 62 silicon carbide epitaxial film, 71 first silicon carbide epitaxial film, 72 second silicon carbide epitaxial film, 80 defect, 81 first defect, 82 second defect, 83 third defect, 84 fourth defect, 90 device active region, 91 dicing region, 92 region, 100 silicon carbide epitaxial substrate, 131 drift region, 132 body region, 133 source region, 134 contact region, 136 gate insulating film, 137 interlayer insulating film, 138 wiring layer, 141 first electrode, 142 second electrode, 143 third electrode, 300 silicon carbide semiconductor device, A distance, D depth, R1 first imaginary circle, R2 second imaginary circle, W1 maximum diameter, W2 gap, W3 third length, W4 fourth width, W5 fifth width, X first direction, Y second direction

The invention claimed is:

1. A method of manufacturing a silicon carbide forming, in a silicon carbide substrate including a silicon carbide single-crystal substrate and a silicon carbide epitaxial film provided on the silicon carbide single-crystal substrate, a plurality of a reference marks serving as a reference of two-dimensional position coordinates;

performing, after the forming the plurality of reference marks, at least one of polishing or cleaning on a reference mark formation surface of the silicon carbide substrate;

specifying, based on the plurality of reference marks, position coordinates of a defect present in the silicon carbide substrate;

forming a device active region in the silicon carbide substrate;

specifying, based on the plurality of reference marks, position coordinates of the device active region; and making a pass/fail judgement of the device active region by associating the position coordinates of the defect with the position coordinates of the device active region, a number of the plurality of reference marks being 2, a distance between the plurality of reference marks being 30 mm or more when viewed in a direction perpendicular to a main surface of the silicon carbide substrate.

2. The method of manufacturing a silicon carbide semiconductor device according to claim 1, wherein in the forming the device active region in the silicon carbide substrate, a formation position of the device active region is adjusted based on the position coordinates of the defect.

3. The method of manufacturing a silicon carbide semiconductor device according to claim 1, wherein the reference marks are provided in the silicon carbide single-crystal substrate, and the device active region is provided in the silicon carbide epitaxial film.

4. The method of manufacturing a silicon carbide semiconductor device according to claim 1, wherein each of the reference marks and the device active region is provided in the silicon carbide epitaxial film.

5. The method of manufacturing a silicon carbide semiconductor device according to claim 1, wherein the reference marks are formed by laser machining.

6. The method of manufacturing a silicon carbide semiconductor device according to claim 1, wherein the reference marks are formed by etching.

7. A silicon carbide substrate including a silicon carbide single-crystal substrate and a silicon carbide epitaxial film provided on the silicon carbide single-crystal substrate, the silicon carbide substrate comprising:

an outer peripheral edge; and a main surface surrounded by the outer peripheral edge, wherein the main surface includes an outer peripheral region which is a region within 5 mm from the outer peripheral edge and a central region surrounded by the outer peripheral region, and a plurality of reference marks serving as references of two-dimensional position coordinates are provided in the outer peripheral region of the silicon carbide epitaxial film, a number of the plurality of reference marks is 2, a distance between the plurality of reference marks is 30 mm or more when viewed in a direction perpendicular to the main surface of the silicon carbide substrate.

8. The silicon carbide substrate according to claim 7, wherein a smallest imaginary circle surrounding each of the plurality of reference marks has a diameter of more than 10 μm and less than 3 mm when viewed in a direction perpendicular to the main surface.

9. The silicon carbide substrate according to claim 7, wherein each of the plurality of reference marks has a depth of more than 0.5 μm and less than 100 μm in a direction perpendicular to the main surface.

10. The silicon carbide substrate according to claim 7, wherein each of the plurality of reference marks has a cross shape when viewed in a direction perpendicular to the main surface.

11. A silicon carbide single-crystal substrate comprising:

an outer peripheral edge; and a main surface surrounded by the outer peripheral edge, wherein the main surface includes an outer peripheral region which is a region within 5 mm from the outer peripheral edge and a central region surrounded by the outer peripheral region, and a plurality of reference marks serving as references of two-dimensional position coordinates are provided in the outer peripheral region, a number of the plurality of reference marks is 2, a distance between the plurality of reference marks is 30 mm or more when viewed in a direction perpendicular to the main surface of the silicon carbide substrate.

12. The silicon carbide single-crystal substrate according to claim 11, wherein a smallest imaginary circle surrounding each of the plurality of reference marks has a diameter of more than 10 μm and less than 3 mm when viewed in a direction perpendicular to the main surface.

13. The silicon carbide single-crystal substrate according to claim 11, wherein each of the plurality of reference marks has a depth of more than 0.5 μm and less than 100 μm in a direction perpendicular to the main surface.

14. The silicon carbide single-crystal substrate according to claim 11, wherein each of the plurality of reference marks has a cross shape when viewed in a direction perpendicular to the main surface.

15. The method of manufacturing a silicon carbide semiconductor device according to claim 1, wherein the plurality of reference marks are not provided in the silicon carbide single-crystal substrate of the silicon carbide substrate.

16. The silicon carbide substrate according to claim 7, wherein the plurality of reference marks are not provided in the silicon carbide single-crystal substrate of the silicon carbide substrate.

17. The silicon carbide substrate according to claim 7, wherein the silicon carbide substrate comprises at least one device active region on the main surface, and the outer peripheral region between the plurality of reference marks is free of the at least one device active region.

18. The silicon carbide substrate according to claim 7, wherein the silicon carbide substrate comprises a plurality of reference marks serving as references of two-dimensional position coordinates provided in an outer peripheral region of the silicon carbide single-crystal substrate, and the plurality of reference marks in the silicon carbide epitaxial film are directly above the plurality of reference marks in the silicon carbide single-crystal substrate.

* * * * *